(12) United States Patent
Achi et al.

(10) Patent No.: US 11,143,808 B2
(45) Date of Patent: Oct. 12, 2021

(54) LIGHT EMITTING MODULE

(71) Applicant: NICHIA CORPORATION, Anan (JP)

(72) Inventors: Yusaku Achi, Tokushima (JP); Toshiaki Moriwaki, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/729,368

(22) Filed: Dec. 28, 2019

(65) Prior Publication Data

US 2020/0209460 A1 Jul. 2, 2020

(30) Foreign Application Priority Data

Dec. 28, 2018 (JP) .............................. JP2018-248411

(51) Int. Cl.
*F21V 8/00* (2006.01)
*G02F 1/13357* (2006.01)

(52) U.S. Cl.
CPC .......... *G02B 6/0036* (2013.01); *G02B 6/0021* (2013.01); *G02B 6/0068* (2013.01); *G02F 1/133602* (2013.01); *G02F 1/133611* (2013.01)

(58) Field of Classification Search
CPC ......... G02F 1/133602–133611; G02B 6/0021; G02B 6/0036; G02B 6/0073
See application file for complete search history.

(56) References Cited

U.S. PATENT DOCUMENTS

| 2004/0096182 | A1 | 5/2004 | Yamashita et al. |
| 2008/0186273 | A1 | 8/2008 | Krijn et al. |
| 2018/0033934 | A1 | 2/2018 | Matsuda et al. |
| 2018/0239193 | A1 | 8/2018 | Hayashi |
| 2018/3035559 | | 11/2018 | Cho |
| 2020/0049877 | A1* | 2/2020 | Watanabe ............ G02B 6/0025 |

FOREIGN PATENT DOCUMENTS

| JP | 2004157472 A | 6/2004 |
| JP | 2007005111 A | 1/2007 |
| JP | 2007180022 A | 7/2007 |
| JP | 2007329114 A | 12/2007 |
| JP | 2008198460 A | 8/2008 |
| JP | 2009506492 A | 2/2009 |

(Continued)

*Primary Examiner* — Sean P Gramling
(74) *Attorney, Agent, or Firm* — Hunton Andrews Kurth LLP

(57) ABSTRACT

A light emitting module have a translucent light guide plate, which has a first primary surface that emits light and an opposite second primary surface, and a plurality of light sources disposed at given intervals on the second primary surface of the light guide plate. The light guide plate is made up of a plurality of light emitting cell regions with a light source disposed in the center section of each of the plurality of light emitting cell regions, an optically functional area is established on the first primary surface in each of the plurality of light emitting cell regions, and each light source is disposed on the second primary surface in a position opposite the corresponding optically functional area. The second primary surface has reflecting depressions at the boundaries between adjacent light-emitting cell regions, and the first primary surface has reflecting grooves positioned away from the center of each cell near the cell boundary.

20 Claims, 16 Drawing Sheets

(56) References Cited

FOREIGN PATENT DOCUMENTS

| | | | |
|---|---|---|---|
| JP | 2009289701 A | 12/2009 | |
| JP | 2011039122 A | 2/2011 | |
| JP | 2011224253 A | 11/2011 | |
| JP | 2013-030404 A | 2/2013 | |
| JP | 2018-018918 A | 2/2018 | |
| JP | 2018101521 A | 6/2018 | |
| JP | 2018-133304 A | 8/2018 | |
| WO | 2012141094 A1 | 10/2012 | |
| WO | WO-2018116815 A1 * | 6/2018 | ....... G02F 1/133603 |

* cited by examiner

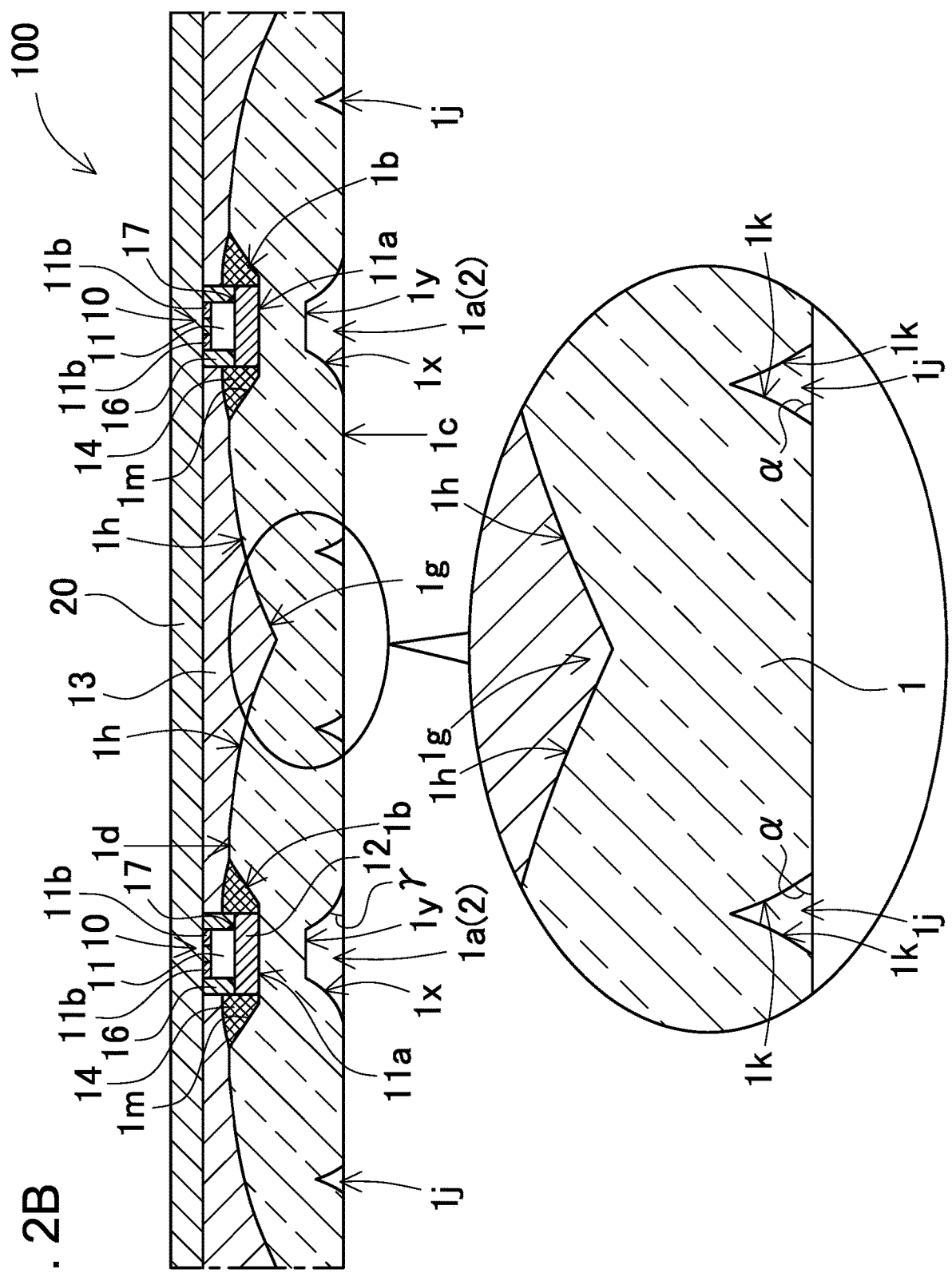

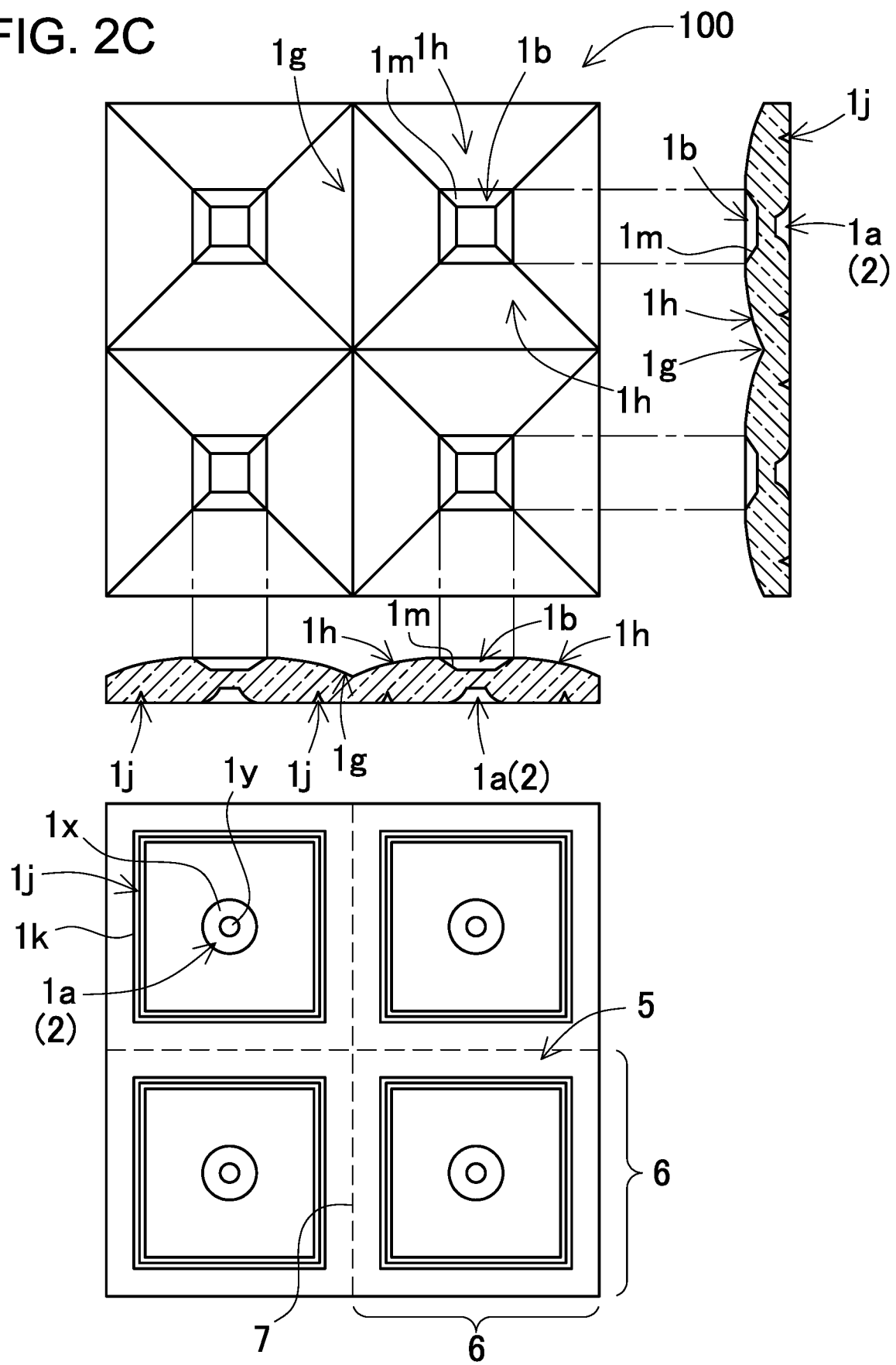

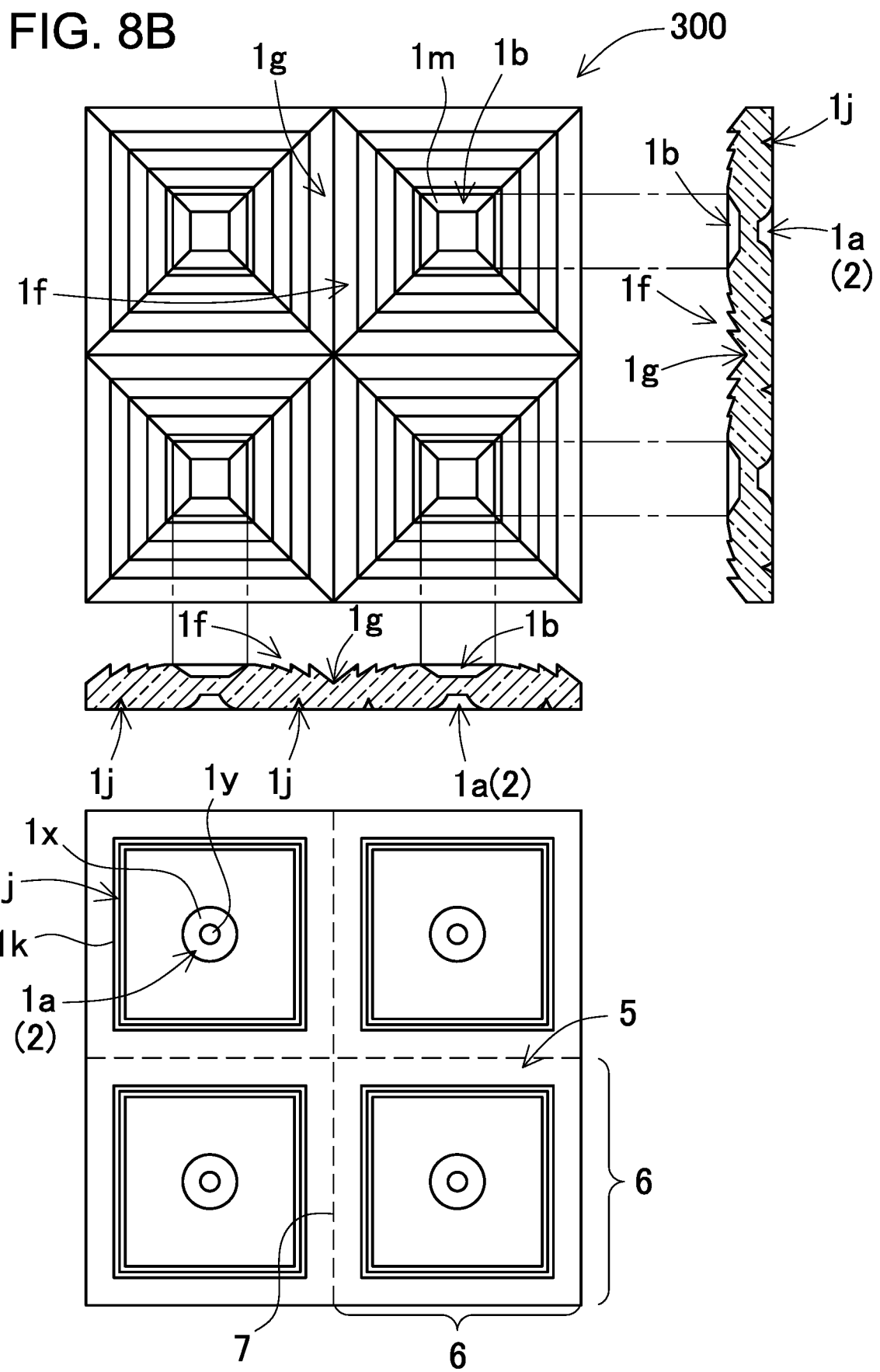

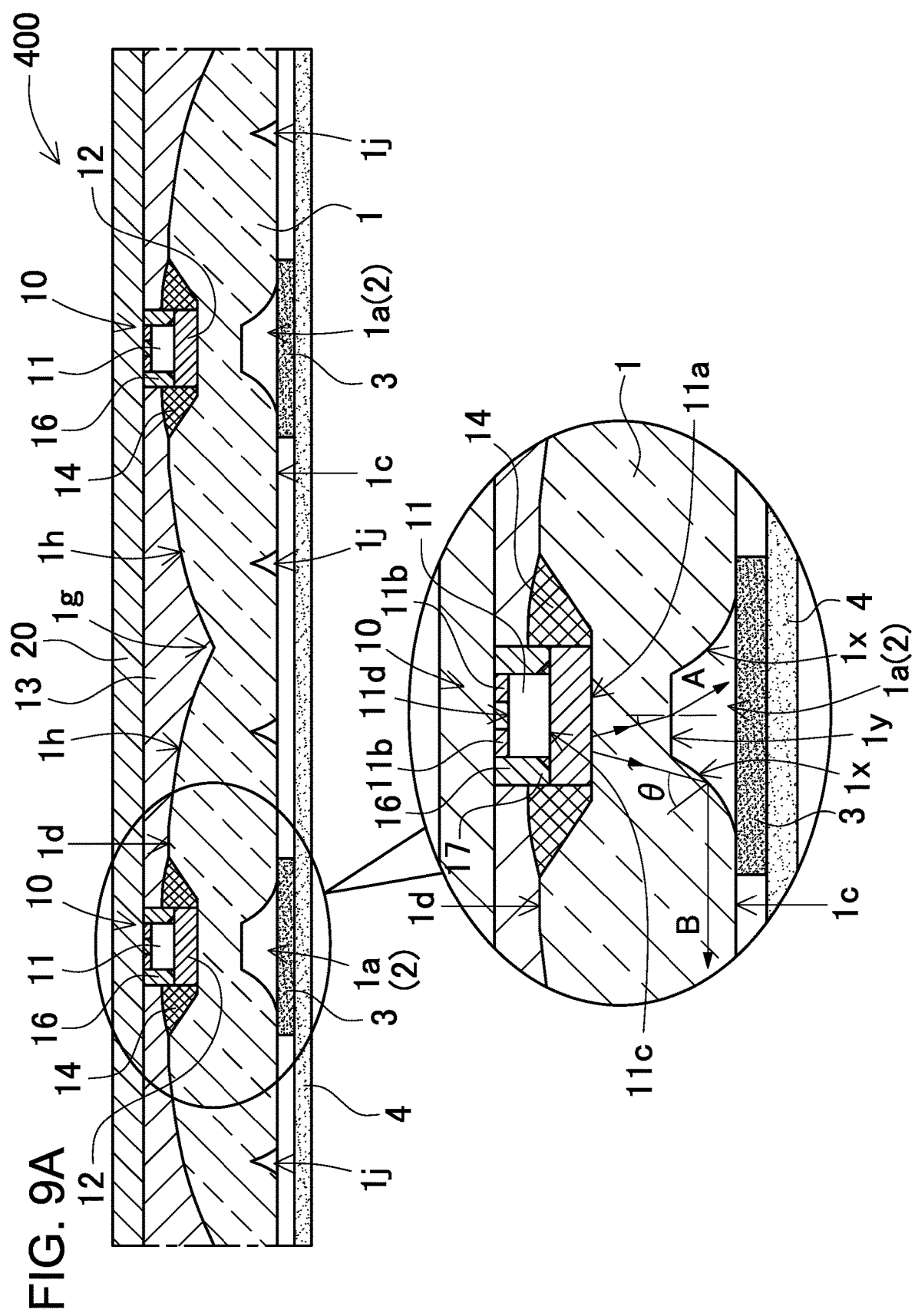

LIGHT EMITTING MODULE

CROSS-REFERENCE TO RELATED APPLICATIONS

The present application claims priority under 35 U.S.C. § 119 to Japanese Patent Application No. 2018-248411, filed on Dec. 28, 2018, the content of which is incorporated herein by references in their entirety.

BACKGROUND OF THE INVENTION

1. Field of the Invention

The present disclosure relates to a light emitting module having a plurality of light emitting devices established on a light guide plate.

2. Description of the Related Art

Light emitting modules that employ a plurality of light emitting devices, such as light emitting diodes, on one surface of a light guide plate are widely used as various light sources in display devices and liquid crystal display backlighting. For example, the light source apparatus disclosed in JP-H10-82915A (1998) has a plurality of light emitting devices disposed on one surface of a light guide plate. The light emitting module disclosed in JP-2009-289701A has conical depressions established on the front side of a light guide plate.

For light emitting modules that have a plurality of light emitting devices disposed at given intervals on one side of a light guide plate, thinness and suppression of brightness non-uniformities are requirements. The present disclosure provides a light emitting module that can suppress brightness non-uniformities while thinning module profile.

SUMMARY

The light emitting module of the present disclosure comprises a translucent light guide plate, which has a first primary surface that is the light emitting surface that emits light to the outside and a second primary surface opposite the first primary surface, and a plurality of light sources disposed at given intervals on the second primary surface of the light guide plate, wherein the light guide plate has a plurality of light emitting cell regions, wherein each of which the plurality of light emitting cell regions has one of the plurality of light sources disposed in the a center section thereof, wherein each of the plurality of cell regions has an optically functional area established on the first primary surface, and each of the plurality of light sources is disposed on the second primary surface in a position opposite the optically functional area, wherein the second primary surface has a plurality of reflecting depressions, wherein at least one of the plurality of reflecting depressions is located at a boundaries cell boundary between adjacent light-emitting cell regions, and wherein the first primary surface has a plurality of reflecting grooves positioned away from the center of each of the plurality of light-emitting cell regions near the cell boundary.

In accordance with the present disclosure, a light emitting module can be provided that can suppress brightness non-uniformities while thinning module profile.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2B is a schematic cross-section view with one section enlarged of a light emitting module according to an embodiment of the present disclosure;

FIG. 2C is a top view, vertical cross-section, horizontal cross-section, and bottom view showing an example of a light guide plate according to an embodiment of the present disclosure;

FIG. 8B is a top view, vertical cross-section, horizontal cross-section, and bottom view showing an example of a light guide plate according to an embodiment of the present disclosure;

FIG. 9A is a schematic cross-section view with one section enlarged of a light emitting module according to an embodiment of the present disclosure;

DESCRIPTION

Figure 1:
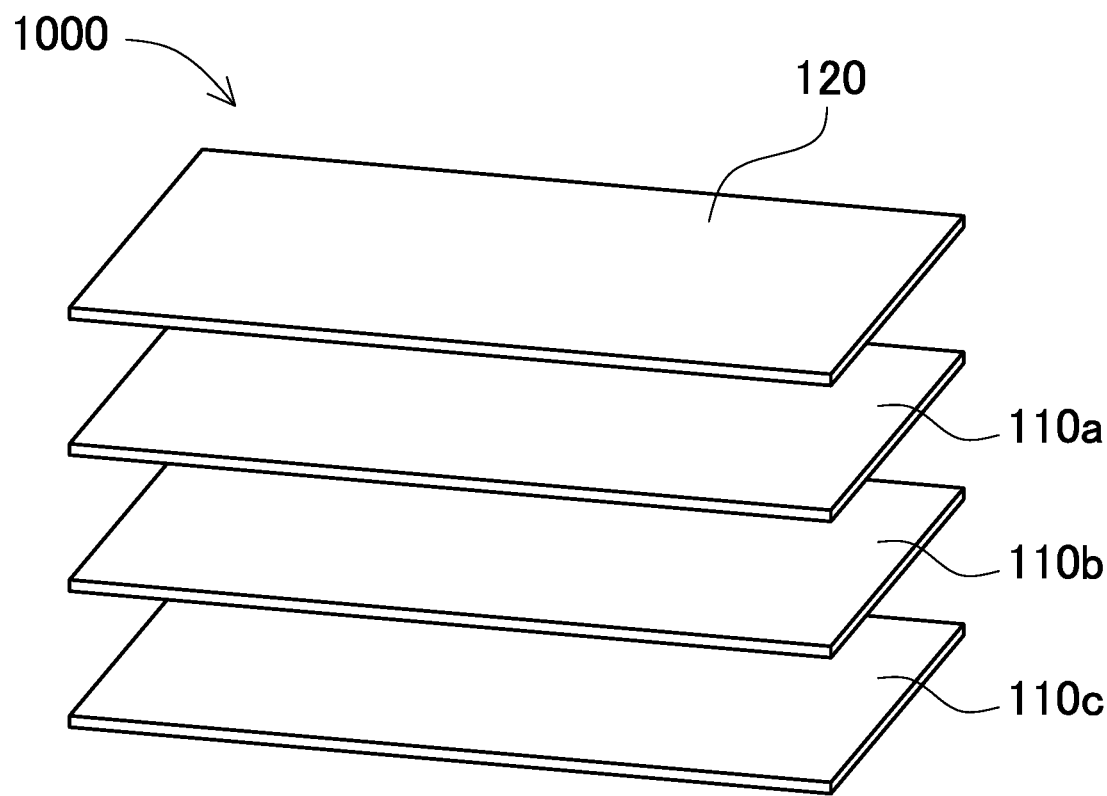
FIG. 1 is a structural diagram showing the components of a liquid crystal display device according to an embodiment of the present disclosure.
Figure 1:
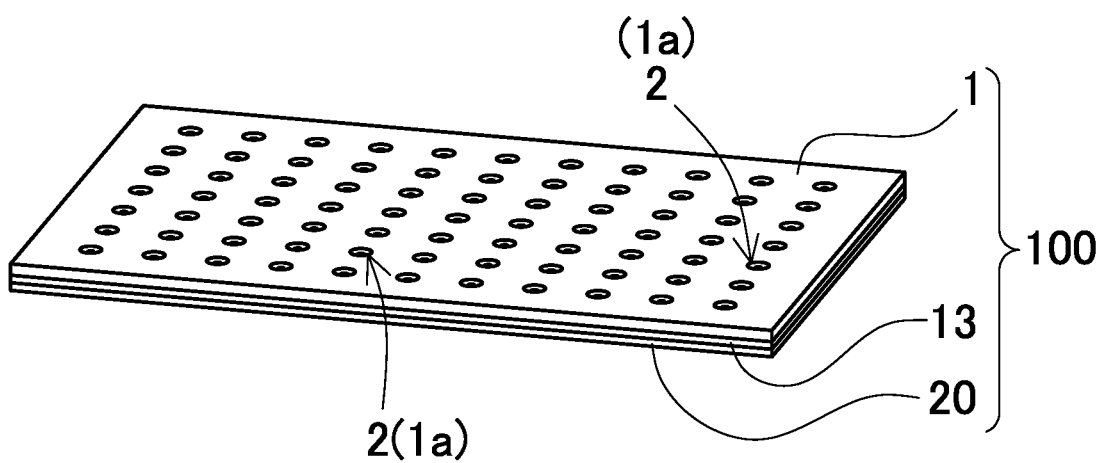

The embodiments will now be described with reference to the accompanying drawings, wherein like reference numerals designate corresponding or identical elements throughout the various drawings. In the following description, specific direction and positional relation terms (such as "upper," "lower," and expressions that include those positional relation terms) are used as required. However, use of those terms is intended to make the invention easily understood when referring to the drawings, and the technical scope of the invention is not limited by the meaning of those terms. Further, parts with the same alpha-numeric reference label appearing in a plurality of drawings indicate the same or equivalent parts or materials. Embodiments described below are merely examples of the light emitting module intended to concretely illustrate technical concepts of the present invention, and the present invention is not limited to the descriptions below. In the absence of specific annotation, structural component features described below such as dimensions, raw material, shape, and relative position are simply for the purpose of explicative example and are not intended to limit the scope of the invention. Further, explanations used to describe one embodiment or example may be used in the description of other embodiments or examples. In addition, properties such as the size and spatial relation of components shown in the figures may be exaggerated for the purpose of clear explanation.

Liquid Crystal Display Device 1000

FIG. 1 is a diagram showing structural components of a liquid crystal display device 1000 for the present embodiment. The liquid crystal display device 1000 shown in FIG. 1 is provided with (in order from the top) a liquid crystal panel 120, two lens sheet layers 110a, 110b, a light diffusion sheet 110c, and a light emitting module 100. The liquid crystal display device 1000 for the present embodiment has the light emitting module 100 disposed behind (beneath in FIG. 1) the liquid crystal panel 120 and is a so-called "direct backlight liquid crystal display device." The liquid crystal display device 1000 shines light emanating from the light emitting module 100 onto the liquid crystal panel 120. Each of the structural components described above can also be a plurality of layers stacked together, and materials such as polarizing film, color filters, and dual brightness enhancement film (DBEF) can also be included.

First Embodiment

Light Emitting Module 100

Figure 2A:
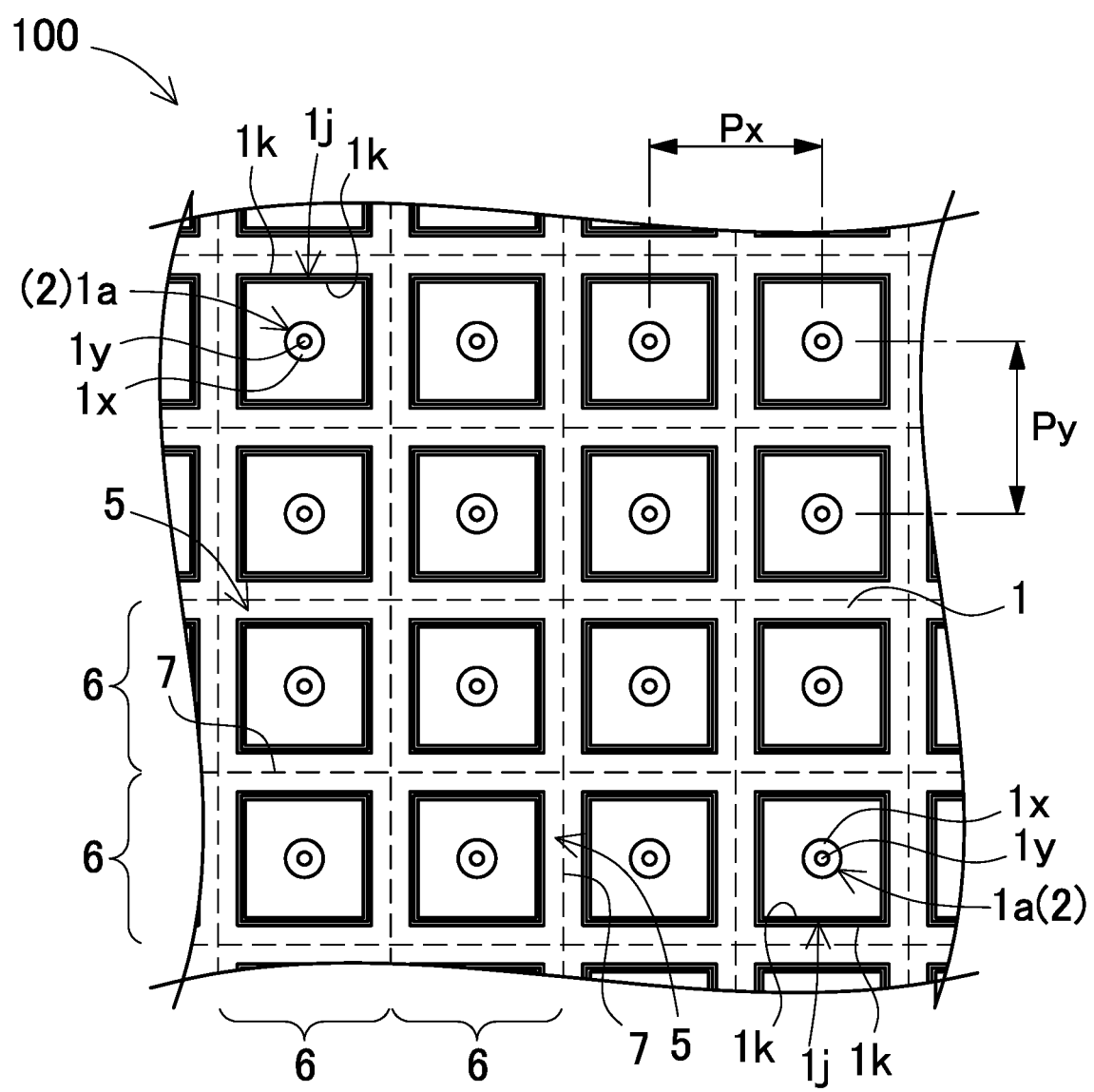
FIG. 2A is a schematic plan-view of a light emitting module according to an embodiment of the present disclosure.

Light emitting module 100 configuration for the present embodiment is shown in FIGS. 2A-2C. FIG. 2A is a schematic plan-view of the light emitting module 100 for the present embodiment. FIG. 2B is a schematic cross-section view with one section enlarged of the light emitting module 100 for the present embodiment. FIG. 2C is a top view, vertical cross-section, horizontal cross-section, and bottom view showing an example of the light guide plate optically functional area and recessed region for the embodiment.

The light emitting module 100 is provided with a light guide plate 1 and a plurality of light emitting devices 11 disposed on the light guide plate 1. The light emitting devices 11 are arrayed in a matrix on the light guide plate 1. The light guide plate 1 connects the plurality of light emitting cells 5 in a single-unit structure. Each light emitting cell 5 is made up of a light emitting device 11 and a section of the light guide plate 1. Accordingly, the light guide plate 1 is made up of a plurality of light emitting cell regions 6, and each cell region 6 has a light emitting device 11 disposed at its center. Cell regions 6 of the light guide plate 1 are aligned vertically and horizontally, and each individual cell region 6 has a rectangular shape. A light emitting cell 5 has a light emitting device 11 at the center of a cell region 6 of the light guide plate 1. Each light emitting cell 5 has a wavelength shifting section 12 disposed between the light emitting device 11 and the light guide plate 1. The light guide plate 1 of the light emitting module 100 is provided with a first primary surface 1c, which is the light emitting surface that emits light to the outside, and a second primary surface 1d, which is the surface on the side opposite the first primary surface 1c. The light guide plate 1 has reflecting depressions 1g established on the second primary surface 1d at the boundaries of adjacent cell regions 6, and has reflecting grooves 1j established on the first primary surface 1c at positions separated from the center of each light emitting cell 5 towards the cell boundary. A wavelength shifting section 12 is disposed in each cell region 6 of the light guide plate 1. Each wavelength shifting section 12 is disposed in a recessed region 1b established in the light guide plate and is sandwiched between the light emitting device 11 and light guide plate 1. The wavelength shifting section 12 changes the wavelength of light emitted from the light emitting device 11 and shines that light into the light guide plate 1. A single light emitting device 11 is allocated to each wavelength shifting section 12.

In the light emitting module of the present disclosure, the light guide plate 1 is configured as a single-unit structure that links a plurality of light emitting cells 5. Specifically, the light guide plate 1 is made up of a plurality of cell regions 6, and each cell region 6 includes a light emitting cell 5 having a light emitting device 11 positioned at its center. Each light emitting cell 5 has an optically functional area 2 established at the center of the cell region 6 on the first primary surface 1c of the light guide plate 1, and a light emitting device 11 is disposed on the second primary surface 1d in a position opposite the optically functional area 2. In addition, the light guide plate 1 has reflecting grooves 1j established on the first primary surface 1c that extend along the boundaries 7 between adjacent cell regions 6.

The light emitting module of the present disclosure can suppress brightness non-uniformities while thinning module profile. The light guide plate 1 has reflecting depressions 1g established on the second primary surface 1d and reflecting grooves 1*j* established on the first primary surface 1*c* positioned in specific opposing locations. At light emitting cell 5 boundary regions where brightness is likely to be diminished, those reflecting depressions 1*g* and reflecting grooves 1*j* efficiently radiate light from inside the light guide plate 1 to the outside, and this can suppress brightness degradation in the boundary regions. Light transmitted through the light guide plate 1 incident on an interface (between the light guide plate 1 surface and the outside) in a boundary region is distanced from the light emitting device 11 and has a large incident angle (between the light ray and the normal to the surface). This large angle of incidence makes the probability of total internal reflection high in the boundary regions. Light that is totally reflected from a light guide plate interface (surface) is not emitted from the panel, and this causes diminished brightness in the cell boundary regions. If light is incident on a transmitting panel surface with an angle smaller than the critical angle, total internal reflection does not occur and that light is emitted to the outside. The light emitting module described above is provided with reflecting depressions 1*g* on the second primary surface 1*d* in the boundary regions 7, and reflecting grooves 1*j* on the first primary surface 1*c* positioned away from the cell centers near the boundary regions 7. Light emitted from a light emitting device 11 that propagates inside the light guide plate 1 in a (lateral) direction parallel to panel surfaces is re-directed by reflecting depressions 1*g* in the boundary regions 7. Reflecting grooves 1*j*, which are positioned away from the cell center near the boundary regions 7, reduce the angle of incidence with respect to the first primary surface 1*c* of both light emitted from the light emitting device 11 and light reflected from the reflecting depressions 1*g*. Light with a smaller angle of incidence is emitted outside the light guide plate 1 and brightness reduction in the boundary regions 7 is suppressed. Reflecting depressions 1*g* on the second primary surface 1*d* in the boundary regions 7 of the light guide plate 1 reflect light that propagates laterally inside the light guide plate 1 parallel to the panel surfaces. Light reflected from the reflecting depressions 1*g* has a high probability of being directed towards the first primary surface 1*c*, and this increases the probability that the reflected light is emitted to the outside from the first primary surface 1*c*. Meanwhile, the reflecting grooves 1*j* positioned on the first primary surface 1*c* near the boundary regions 7 away from the light emitting cell 5 center emit both light emitted from the light emitting device 11 and light reflected from the reflecting depressions 1*g* outside the light guide plate 1 to suppress boundary region 7 brightness degradation. A light guide plate 1 with reflecting grooves 1*j* disposed on the first primary surface 1*c* and reflecting depressions 1*g* disposed on the second primary surface 1*d* in cell boundary regions 7 and near cell boundary regions 7 away from cell centers utilizes the synergistic effect of those recessed regions to reflect light propagating inside the panel and refract incident light outside the panel to effectively suppress brightness non-uniformity while allowing the light guide plate 1 to be made thinner. In particular, compared to a light emitting module with no reflecting grooves 1*j*, since reflecting grooves 1*j* are established away from light emitting cell 5 centers near the boundary regions 7, light incident to the surface of the reflecting grooves 1*j* attains a smaller angle over a wide area to suppress brightness reduction due to total internal reflection. By suppressing brightness reduction at a distance from the light emitting device 11, reflecting grooves 1*j* allow the light emitting devices 11 to be arrayed with a wider pitch interval and makes low-cost manufacturing possible.

In addition to reflecting depressions 1*g* and reflecting grooves 1*j*, the light emitting module of the present disclosure has optically functional areas 2 disposed on the optical axis of each light emitting device 11 where luminance is high. Each optically functional area 2 diffuses light, which enters the light guide plate 1 from the light emitting surface 11*a* of a light emitting device 11, from the optical axis to surrounding areas, thereby diffusing strong light emission along the optical axis. The reflecting grooves 1*j* refract light diffused by the optically functional areas 2 to the outside allowing more effective suppression of brightness non-uniformity with an overall thin profile.

Since there is little distance between the liquid crystal panel and light emitting module in a direct backlight liquid crystal display device, it is possible for light emitting module brightness non-uniformities to affect liquid crystal display device brightness uniformity. Accordingly, a light emitting module having little brightness non-uniformity is desirable as the light emitting module in a direct backlight liquid crystal display device.

A light emitting module 100 configured according to the present embodiment can be made thin, and can have a typical thickness less than or equal to 5 mm, less than or equal to 3 mm, or less than or equal to 1 mm.

The light emitting module 100 shown in FIG. 2B is provided with light emitting device units 10 as light sources, and each light emitting device unit 10 is provided with a light emitting device 11, a wavelength shifting section 12 that covers the primary light emitting surface 11*c* of the light emitting device 11, and a light reflecting material 16 that covers lateral surfaces of the light emitting device 11. As shown in FIG. 2B, by fixing each light emitting device unit 10 in a recessed region 1*b* of the light guide plate 1, a light emitting device 11 and wavelength shifting section 12 is established at prescribed locations on the light guide plate 1, and emission from the light emitting device 11 enters the light guide plate 1 through the wavelength shifting section 12. However, light emitting module configuration does not necessarily require each light emitting device and wavelength shifting section to be disposed as a light emitting device unit on the light guide plate. For example, a recessed region formed in the light guide plate can be filled with wavelength shifting material to form a wavelength shifting section, and a light emitting device can be joined onto the wavelength shifting section to also establish a light emitting device and wavelength shifting section at a specified position on the light guide plate.

The light emitting module 100 shown in FIG. 2B is also provided with optically functional areas 2 on the first primary surface 1*c* of the light guide plate 1. An optically functional area 2 is disposed on the optical axis of each light emitting device 11, and light emitting device 11 light is radiated to the outside via the optically functional area 2.

In the light emitting module 100 described above, light emitted from the light emitting device 11 enters the light guide plate 1 through the wavelength shifting section 12. In the present application, since the "light emitting surface of the light emitting device" indicates the surface where light emitting device light enters the light guide plate, the surface of the wavelength shifting section (surface of the light emitting device unit) becomes the light emitting surface of the light emitting device for a light emitting module where light emitting device light passes through the wavelength shifting section into the light guide plate. However, the light emitting module is not limited to a configuration where light emitting device light passes through a wavelength shifting section into the light guide plate. For example, light emitting device light can also be directed into the light guide plate through a light conditioning layer (or layers). In a light emitting module where light emitting device light passes into the light guide plate through a light conditioning layer, the light emitting surface of the light emitting device becomes the surface of the light conditioning layer. The light conditioning layer can be, for example, a layer that scatters light from the light emitting device into the light guide plate, and can be any layer that adjusts or controls light from the light emitting device and introduces it into the light guide plate. In this case, light emitting device units can be configured with light conditioning layers in place of the wavelength shifting sections, and by disposing those light emitting device units on the light guide plate, light from the light emitting devices shines into the light guide plate through the light conditioning layers.

The following describes in detail structural elements and fabrication methods for the light emitting module 100 of the present embodiment.

Light Guide Plate 1

The light guide plate 1 is translucent material that emits light, which is incident from the light emitting devices 11, from its surface. The light guide plate 1 of the present embodiment is provided with a first primary surface 1*c*, which is the light emitting surface, and a second primary surface 1*d*, which is the surface on the side opposite the first primary surface 1*c*. A plurality of light emitting devices 11 is disposed on the second primary surface 1*d* of the light guide plate 1. Each light emitting device 11 is positioned at the center of a light guide plate 1 cell region 6. A configuration, which disposes light emitting devices 11 in recessed regions 1*b* in the light guide plate 1 second primary surface 1*d*, can reduce distance between the light emitting devices 11 and the light guide plate 1 and make it possible to thin the profile of the light emitting module 100. The length of one side of the light guide plate 1 can be, for example, on the order of 1 cm to 200 cm, and preferably on the order of 3 cm to 30 cm. Light guide plate 1 thickness can be on the order of 0.1 mm to 5 mm, and preferably on the order of 0.5 mm to 3 mm. The light guide plate 1 can have planer shape such as approximately rectangular or approximately circular.

Optically transparent material such as glass or resin material including thermoplastic resins such as acrylic, polycarbonate, cyclic polyolefin, polyethylene-terephthalate, and polyester, or thermosetting resins such as epoxy and silicone can be used as light guide plate 1 material. In particular, thermoplastic resin materials are preferable because they allow efficient manufacturing by injection molding. Among those thermoplastic resins, inexpensive polycarbonate has high transparency and is preferable. Since high temperature processing such as re-flow soldering can be avoided in a light emitting module where the wiring circuit board is affixed to the light guide plate 1 after light emitting device 11 mounting, even thermoplastic material with low heat-resistance such as polycarbonate can be employed. The light guide plate 1 can be molded by processing such as injection molding, transfer molding, or thermal transfer molding. As described subsequently, in a light guide plate 1 provided with optically functional areas 2 and recessed regions 1*b*, it is desirable to form those elements in a single mold step. This can minimize optically functional area 2 and recessed region 1*b* molding misalignment.

The light guide plate 1 of the present embodiment can be formed as a single layer or can be made by laminating a plurality of translucent layers. In the case where a plurality of translucent layers are laminated together, it is preferable to establish a layer (or layers) having a different index of refraction, for example an air layer, between arbitrary layers. This can cause light to be more readily diffused and can make a light emitting module with reduced brightness non-uniformity. This type of structure can be implemented, for example, by establishing spacers to separate a plurality of arbitrary translucent layers and establish an air layer (or layers). In addition, a layer having a different index of refraction, for example an air layer, can also be provided between a translucent layer disposed on top of the first primary surface 1*c* of the light guide plate 1. This can cause light to be more readily diffused and can produce a liquid crystal display device having reduced brightness non-uniformity. This type of structure can be implemented, for example, by establishing spacers that separate arbitrary translucent layers of the light guide plate 1 to establish an air layer.

Optically Functional Areas 2

The light guide plate 1 has optically functional areas 2 established in the first primary surface 1*c*. For example, an optically functional area 2 can have the capability to spread incident light within the interior of the light guide plate 1. The optically functional area 2 is provided with material that, for example, has a different index of refraction than the light guide plate 1. Specifically, as shown in FIG. 2B, an optically functional area 2 can be configured as a recessed region 1*a* established in the light guide plate 1. In the optically functional area 2 of this figure, the inside periphery surface of the recessed region 1*a* is established as an inclined surface 1*x*. The inclined surface 1*x* has a slope that increases (in FIG. 2B) as it extends towards the center of the recessed region 1*a* and approaches the light emitting device 11. When the angle γ is the angle of inclination of the inclined surface 1*x* with respect to the first primary surface 1*c* for the optically functional area 2 shown in the cross-section of FIG. 2B, the inclined surface 1*x* has a shape such that the angle of inclination γ gradually increases as the surface approaches the center of the optically functional area 2. By establishing each optically functional area 2 in this configuration, light that enters the light guide plate 1 from the light emitting surface 11*a* of a light emitting device 11 is more effectively spread laterally (in directions parallel to light guide plate surfaces) inside the light guide plate 1. Further, the optically functional area 2 is provided with a planar region 1*y* at the base of the recessed region 1*a*. The optically functional area 2 planar region 1*y* is disposed at the center of the recessed region 1*a*. An optically functional area 2 provided with a planar region 1*y* at the center of the recessed region 1*a* can limit the detrimental effect of light guide plate 1 strength reduction due to recessed region 1*a* formation. This is because a planar region 1*y* established at the center of the recessed region 1*a* can increase the minimum thickness of the light guide plate 1. It is preferable to dispose each optically functional area 2 at the optical axis of each light emitting device 11, and it is more preferable to dispose the planar region 1*y* of each optically functional area 2 at the optical axis of each light emitting device 11. Compared to an optically functional area 2 with no planar region, an optically functional area 2 with a planar region 1*y* can reduce brightness non-uniformity due to (relative position) misalignment between the light emitting device 11 and optically functional area 2. This is because the planar region 1*y* is established parallel to the light emitting surface 11*a* of the light emitting device 11, and accordingly brightness non-uniformity due to planar region 1y-light emitting surface 11a misalignment is decreased. Although not illustrated, the optically functional area can be formed as a recessed region (cavity) with a shape such as inverted conical, or four sided, six sided, or polygonal inverted pyramid shape, and the base can have a planar region (e.g. truncated conical) or not.

At the optically functional area 2 interface between the recessed region 1a inclined surface 1x and material (such as air) having an index of refraction different than that of the light guide plate 1, a configuration can be used that reflects incident light from the light emitting device 11 in directions lateral with respect to the light emitting device 11. Further, a light reflecting material (for example, a metallic reflecting layer or white resin) can also be established in recessed regions 1a having inclined surfaces 1x. Although inclined surfaces 1x of the optically functional areas 2 are shown as curved lines in cross-section, they can be straight lines as well. The inclined surfaces 1x of optically functional areas 2 shown in the cross-sections of FIGS. 2B and 2C appear as curved lines with an angle of inclination γ that gradually increases towards the center of each recessed region 1a. However, the cross-section of the inclined surfaces can also be straight line segments having different angles of inclination γ, and those angles of inclination can gradually increase towards the center of each recessed region.

As described subsequently, an optically functional area 2 is established corresponding to each light emitting device 11. Specifically, it is desirable to dispose each optically functional area 2 at the position of each light emitting device 11 on the second primary surface 1d, but on the opposite side (first primary surface 1c) of the light guide plate. In particular, it is desirable to approximately align the center-axis of each optically functional area 2 with the optical axis of each light emitting device 11.

The size of the optically functional areas 2 can be set as required. The optically functional areas 2 shown in FIG. 2B have a circular outline in plan-view, and that circular perimeter is made larger than outline of each wavelength shifting section 12, which is the light emitting surface 11a of each light emitting device 11. These optically functional areas 2 can more effectively reflect light incident to the light guide plate 1 from the light emitting surfaces 11a of light emitting devices 11 and spread that light laterally inside the light guide plate 1. In a configuration where light emission from a light emitting device 11 enters the light guide plate 1 through a wavelength shifting section 12, light shines into the light guide plate 1 in all directions from the wavelength shifting section 12. While light emitted into the light guide plate 1 is efficiently spread laterally inside the panel by total internal reflection at the interface of an optically functional area 2, part of that light is reflected internally parallel to light guide plate 1 surfaces, and part of that light is not reflected internally and passes through the optically functional area 2 to shine outside the light guide plate 1 from the first primary surface 1c.

Reflecting Depressions 1g

The light guide plate 1 of the light emitting module 100 is provided with reflecting depressions 1g in boundary regions 7 of the cell regions 6. The light guide plate 1 reflecting depressions 1g shown in FIGS. 2A-2C are provided with reflecting surfaces 1h that reflect light from the light emitting devices 11. Each reflecting surface 1h is a curved surface that is deepest at cell region 6 boundary region 7 center-lines. This light emitting module 100 has reflecting depressions 1g established at boundary region 7 lines, and reflecting surfaces 1h are established on both sides of those lines. The reflecting surfaces 1h take the form of curved surfaces that essentially cover the entire second primary surface 1d. Light from the light emitting devices 11 can be efficiently reflected by reflecting surfaces 1h in a light emitting module 100 with this configuration. However, the light guide plate is not limited to reflecting depressions with this structure, and the light guide plate surface can be made planar as well.

Reflecting depression 1g depth is less than or equal to 1 mm, preferably 0.4 mm to 0.8 mm, and more preferably 0.5 mm to 0.6 mm. FIG. 2B shows an example where reflecting depression 1g depth is greater than recessed region 1b depth. This configuration can efficiently reflect light from light emitting devices 11 and allows uniform light emission from the surface of the light emitting module.

Reflecting Grooves 1j

The light guide plate 1 shown in FIGS. 2A-2C has reflecting grooves 1j established on the first primary surface 1c away from cell 6 center regions near the boundary regions 7. In addition, those reflecting grooves 1j extend parallel to the rectangular cell outline, which is the perimeter of each cell region 6. This configuration allows light inside each cell region 6 to be effectively utilized, and can increase cell brightness. A configuration, which disposes reflecting grooves 1j along boundary regions 7 of rectangular cell regions 6 with a layout parallel to cell region 6 perimeters, can suppress brightness reduction in the vicinity of cell boundary regions 7. Each reflecting groove 1j is a trench or groove configured with inclined surfaces 1k that slope with respect to the first primary surface 1c. Further, for reflecting grooves 1j shown in the figures, the angle of inclination α between an inclined surface 1k and the first primary surface 1c increases gradually from the first primary surface 1c towards the interior of the light guide plate 1. Reflecting grooves 1j having this shape can extract more light from the first primary surface 1c of the light guide plate 1, and this can reduce brightness non-uniformity in cell boundary regions 7 and, in particular, this can further reduce brightness non-uniformity on both sides of the reflecting grooves 1j. The reflecting grooves 1j in the figures are V-shaped grooves with inclined surfaces 1k on both sides of the grooves, and the inclined surfaces 1k are symmetric about the center of the V-shaped grooves. However, the reflecting grooves do not necessarily have symmetric side-walls and groove shape is not limited to a V-shape.

The reflecting grooves 1j and reflecting depressions 1g in the light guide plate 1 shown in FIG. 2B extend along the boundary regions 7 and have parallel disposition on opposite sides of the light guide plate 1. The bottom or deepest part of the reflecting grooves 1j and reflecting depressions 1g extend as straight-lines following the boundary regions 7. More specifically, the deepest part of the reflecting grooves 1j and reflecting depressions 1g are lines that extend along the first primary surface 1c and second primary surface 1d in asymmetric locations, which are not (vertically) symmetric across the thickness of the light guide plate 1. In the light guide plate 1 of the figures, lines along the deepest part of the reflecting depressions 1g are coincident with the centers of the cell boundary regions 7, and lines along the deepest part of the reflecting grooves 1j are disposed on both sides of those reflecting depression 1g (bottom) lines. Light extraction from the center of the cell regions 6 and from the light guide plate 1 first primary surface 1c under the reflecting depressions 1g is favorable and those regions tend to be bright. Compared to those regions, other parts of the cell regions 6 have a tendency to be darker. The reflecting grooves 1j improve light extraction at locations within cell regions 6 that have a tendency to be dark. A light guide plate 1 with reflecting grooves 1j and reflecting depressions 1g disposed in vertically asymmetric locations on both sides of the panel can establish the deepest part of the reflecting grooves 1j and reflecting depressions 1g as lines on both sides of the light guide plate 1 while avoiding strength reduction due the grooves and depressions, and can suppress brightness non-uniformity. In a configuration that establishes lines of grooves and depressions on both sides of a thin light guide plate 1, strength (robustness) reduction due to those grooves and depressions is an issue. In a configuration that establishes those lines of grooves and depressions in vertically asymmetric locations, the regions thinned by groove or depression formation are different on opposite sides of the panel. Accordingly, this light guide plate 1 configuration has the characteristic that strength reduction can be minimized while establishing grooves and depressions on both sides of the panel. Particularly, in a light emitting module that employs an extremely thin light guide plate, this characteristic is an especially important property. In addition, since light inside a cell is effectively used within that cell region, darkening at light reflecting surfaces 1h in cells adjacent to the reflecting depressions 1g can be suppressed. These features are effective in functions such as local dimming mode and high dynamic range (HDR) image display.

Although each cell region 6 of the light guide plate 1 in FIGS. 2A-2C is provided with a single row of reflecting grooves 1j that extend along perimeter boundary regions 7, a plurality of reflecting groove rows can also be established in parallel orientation.

The width and depth of each reflecting groove 1j can be designed according to various factors including application objective, light emitting device 11 light emitting characteristics, and light guide plate 1 thickness. As an example, using a polycarbonate light guide plate 1 with a thickness of 1.1 mm, reflecting grooves 1j are established having a width of 0.2 mm and depth of 0.30 mm.

Alignment Sections, Recessed Regions 1b

Figure 4A:
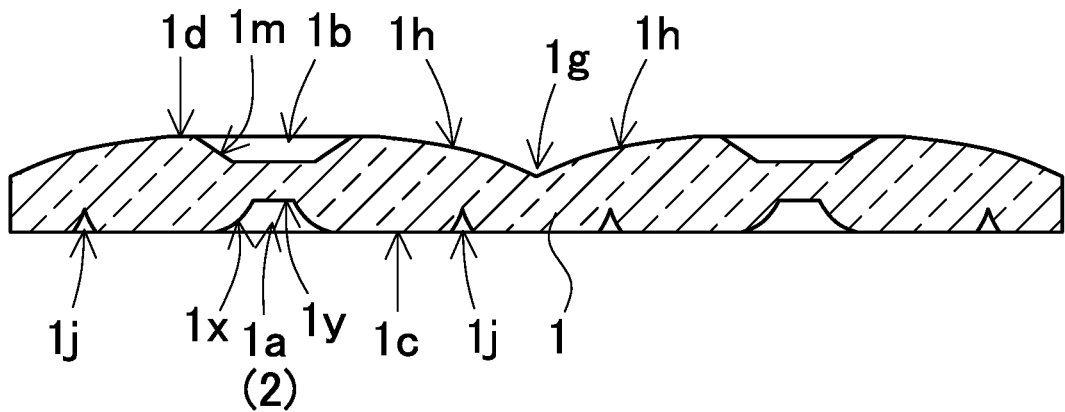
FIG. 4A is an enlarged cross-section schematic showing an example of a light emitting module process step according to an embodiment of the present disclosure.

An alignment section can be provided on the second primary surface 1d of the light guide plate 1. The alignment section can be any structure that can mark the light emitting device 11 mounting location. Specifically, the alignment section can be, for example, a recessed region 1b as shown in FIGS. 2A, 2B, and 4A, or a protruding region or groove(s). The plan-view size of the recessed region 1b can be, for example 0.05 mm-10 mm, and preferably 0.1 mm-1 mm. Recessed region 1b depth can be 0.05 mm-4 mm, and preferably 0.1 mm-1 mm. Distance (vertically) between an optically functional area 2 and a recessed region 1b can be set as required within a range that establishes separation between the optically functional area 2 and recessed region 1b.

The shape of a recessed region 1b in plan-view can be rectangular or circular for example, and that shape can be selected based on the pitch (distance between two closest recessed regions) of the recessed region 1b array. For a recessed region 1b array that has approximately uniform pitch, an approximately square or circular shape is desirable. Of those shapes, an approximately circular shaped recessed region 1b allows light from the light emitting device 11 to expand outward in a favorable manner.

The recessed regions 1b shown in FIG. 2C have a plan-view outline that is approximately square. In addition, the recessed regions 1b in the figure have inclined surfaces 1m that slope downward from the perimeter of each square opening towards the base (bottom surface) of each recessed region 1b establishing an overall shape that is an inverted four sided conical frustum (truncated square pyramid). Each recessed region 1b shown in FIG. 2 has a planar base (bottom surface) that is formed larger than the opposing surface of the wavelength shifting section 12, which is the light emitting surface 11a of the light emitting device unit 10. This allows light emitting device units 10 to be reliably positioned with respect to recessed region 1b bottom surfaces. Although described subsequently in greater detail, light emitting device units 10 are fixed in given positions within the recessed regions 1b by filling those regions with translucent bonding material 14. Although perimeter side-walls of the recessed regions 1b described above are inclined surfaces 1m, the recessed regions can be made with vertical side-walls as well.

Light Emitting Device Unit 10

A light emitting device unit 10 is provided with a light emitting device 11, a wavelength shifting section 12 that covers the primary light emitting surface 11c of the light emitting device 11, and a light reflecting material 16 that covers light emitting device 11 side-walls. In the light emitting device units 10 shown in FIG. 3E, light emitting devices 11 are joined to the surfaces of wavelength shifting sections 12 to cover the primary light emitting surfaces 1c of the light emitting devices 11 with wavelength shifting sections 12. Each light emitting device 11 is joined to the surface of a wavelength shifting section 12 via translucent adhesive 17. In a plan view, the outline of a wavelength shifting section 12 is made larger than the outline of a light emitting device 11 for the light emitting device units 10 in FIG. 3E. This light emitting device unit 10 passes more light irradiated from the primary light emitting surface 11c of the light emitting device 11 through the wavelength shifting section 12 into the light guide plate 1 to reduce color and brightness non-uniformities. Further, side-walls of the light emitting device 11 in each light emitting device unit 10 may be covered with the light reflecting material 16. In light emitting device units 10 shown in the figures, outer side surfaces of the light reflecting material 16 and side surfaces of the wavelength shifting sections are approximately co-planar.

Wavelength Shifting Section 12

The light emitting module 100 of the present embodiment is provided with wavelength shifting sections 12 that diffuse and shift the wavelength of light from the light emitting devices 11. As shown in FIG. 2B, wavelength shifting sections 12 are disposed on the light guide plate 1 second primary surface 1d between the light guide plate 1 and each light emitting devices 11. A wavelength shifting section 12 internally diffuses light input from the light emitting device 11 and makes it more uniform. By assembling each light emitting device 11 and wavelength shifting section 12 as a single light emitting device unit 10 for the light emitting module 100 in the figures, the primary light emitting surface 11c of each light emitting device 11 is covered by a wavelength shifting section 12. With the objective of making the light emitting module thin, it is desirable to dispose each wavelength shifting section 12 inside a recessed region 1b (described previously) in the light guide plate 1 as shown in FIG. 2B.

Figure 5:
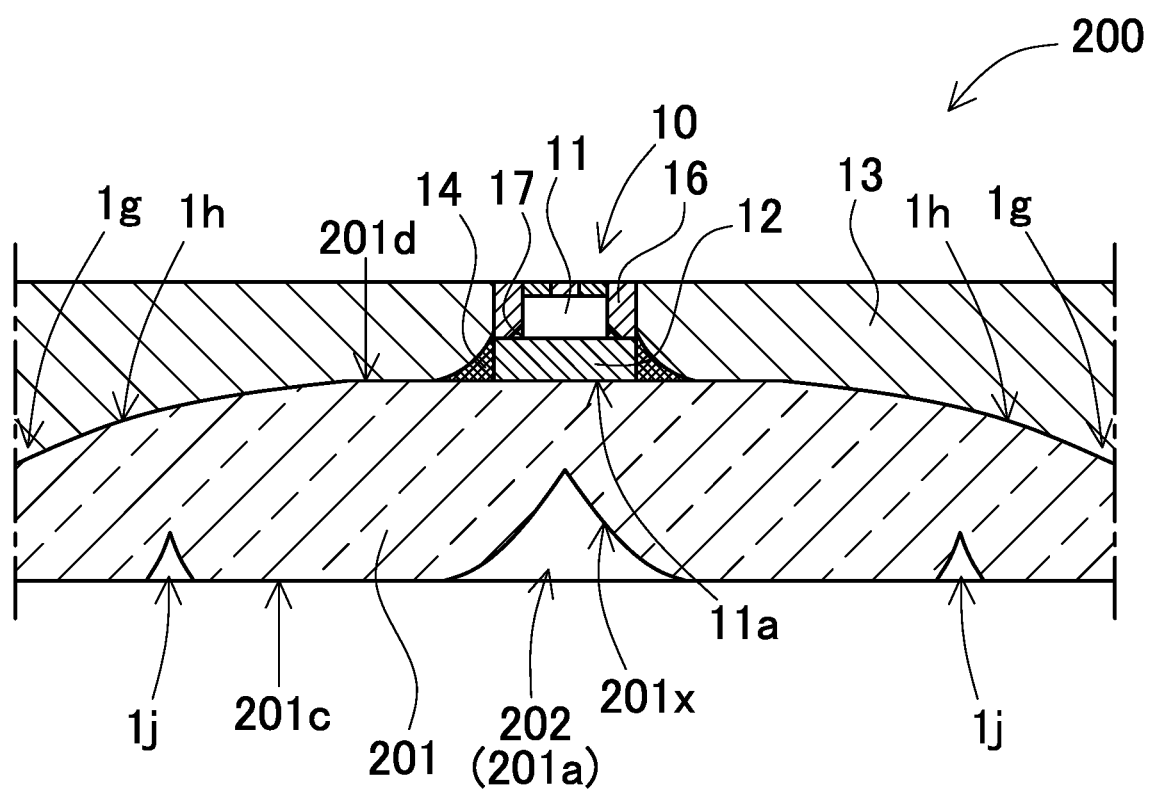
FIG. 5 is an enlarged cross-section schematic of a light emitting module according to another embodiment of the present disclosure.

However, as shown in the light emitting module 200 of FIG. 5, wavelength shifting sections 12 can also be disposed on an approximately planar second primary surface 201d of the light guide plate 201. By solidly joining the wavelength shifting section 12 of a light emitting device unit 10 onto the second primary surface 201d of an approximately planar light guide plate 201, the wavelength shifting section 12 is disposed between the light guide plate 201 and light emitting device 11 in the light emitting module 200 shown in FIG. 5. This light emitting device unit 10 is attached, for example, via translucent adhesive 17. Accordingly, wavelength shifting sections 12 can also be disposed in a manner protruding from the second primary surface 201d.

The light guide plate 201 shown in FIG. 5 is not provided with recessed region in the second primary surface 201d, and that second primary surface 201d has a planar configuration where the light emitting device units 10 are disposed. In addition, the light guide plate is provided with optically functional areas 202 that are recessed regions 201a having an inverted conical shape and inclined surfaces 201x established inside recessed region 201a perimeters. In the figure, each inclined surface 201x has a slope that increases towards the center of the recessed region 201a in a manner that approaches the light emitting device 11. The optically functional area 202 shown in FIG. 5 has inclined surfaces 201x with angles of inclination that gradually increase towards the center of the optically functional area 202. Since the light guide plate shown in FIG. 5 is approximately planar with no recessed region formed in the second primary surface 201d, the recessed region 201a formed in the first primary surface 201c, which is aligned with the light emitting surface 11a of the light emitting device 11, can be formed with significant depth and still maintain light guide plate strength (robustness). By establishing optically functional areas 202 with this configuration, light entering the light guide plate 201 from the light emitting surfaces 11a of the light emitting devices 11 can be more effectively spread laterally in directions along the light guide plate 201 surfaces. Although not illustrated, the optically functional areas can also be formed as recessions (cavities) with shapes such as inverted conical, or four sided, six sided, or polygonal inverted pyramids. Further, these optically functional areas 202 can also be established with planar regions at their bases (deepest parts).

In addition, although not illustrated, light emitting module wavelength shifting sections can also be formed by filling recessed regions formed in the light guide plate with wavelength shifting material. In this light emitting module, it is desirable to establish a plurality of physically separated wavelength shifting sections. This can curtail the amount of wavelength shifting material used. Further, it is preferable to provide a single wavelength shifting section for each light emitting device. This can make light from the light emitting devices uniform in the wavelength shifting sections and consequently can reduce brightness and color non-uniformities.

Wavelength shifting sections made by filling recessed regions with wavelength shifting material can be formed by techniques such as potting, printing methods, or spray application. In the case of wavelength shifting section formation by disposing wavelength shifting material inside light guide plate recessed regions, for example, after applying wavelength shifting material in liquid form to the second primary surface of the light guide plate, the plurality of recessed regions can be filled using a squeegee, which can form the wavelength shifting sections in (high quantity) manufacturable manner.

Further, pre-formed wavelength shifting sections can be prepared to fill light guide plate recessed regions or for disposition on top of the second primary surface. Methods of making pre-formed wavelength shifting sections include, for example, wavelength shifting material in sheet or board form singulated by methods such as cutting or punching. Or, single-piece wavelength shifting sections can be pre-molded by methods such as injection molding, transfer molding, or compression molding. The pre-formed wavelength shifting sections can be attached inside recessed regions or on top of the second primary surface using material such as bonding adhesive.

The size and shape of each wavelength shifting section 12 can be, for example, similar to the recessed regions 1b described above. Wavelength shifting section height is preferably on the same order as recessed region depth or greater than recessed region depth.

Incidentally, regions of the light guide plate 1 first primary surface 1c excluding the optically functional areas 2 can have treatments that produce effects such as light diffusion or reflection. For example, by establishing a dimpled (bumpy) surface or surface roughness in locations separated from the optically functional areas, light can be further diffused to reduce brightness non-uniformity.

As the base material (matrix) of the wavelength shifting sections, translucent material such as epoxy, silicone, epoxy-silicone mixtures, or glass can be used. From the standpoint of stability with respect to light exposure and ability to be easily molded, the choice of silicone as wavelength shifting section base material is favored. It is desirable for the wavelength shifting section 12 base material to have an index of refraction that is greater than that of the light guide plate 1 material.

As wavelength shifting material included in the wavelength shifting sections 12, phosphors such as yttrium-aluminum-garnet (YAG) phosphor, β-SiAlON phosphor, KSF fluoride system phosphors, and nitride system phosphors should be mentioned. In particular, a plurality of different phosphor materials can be used in a single wavelength shifting section 12. More preferably, by including β-SiAlON phosphor that radiates green light and KSF fluoride system phosphor that radiates red light in the wavelength shifting sections 12, the range of colors produced by the light emitting module can be widened. Further, for example, when light emitting devices 11 that emit blue light are used, the wavelength shifting sections 12 can include greater than or equal to 60 wt % (weight percent) KSF system (red) phosphor and preferably greater than or equal to 90 wt % to enable red light to be produced. Specifically, by including wavelength shifting material that produces a specific color in the wavelength shifting sections, light of a specified color can be emitted. In addition, wavelength shifting material can also be quantum dots. Wavelength shifting material can be disposed in any configuration inside the wavelength shifting sections 12. For example, wavelength shifting material can be approximately uniformly distributed or unevenly distributed. Or, a plurality of layers with each layer including designated wavelength shifting material can be stacked together.

The wavelength shifting sections 12 can also include, for example, fine particles of $TiO_2$, or $SiO_2$ in the resin material cited above to establish a light scattering layer.

Light Emitting Devices 11

The light emitting devices 11 are the light source of the light emitting module 100. A plurality of light emitting devices 11 is disposed on the light guide plate 1.

A light emitting device 11 has a primary light emitting surface 11c and a pair of electrodes 11b on the electrode patterning surface 11d, which is the side opposite the primary light emitting surface 11c. The pair of electrodes 11b are laid-out to correspond with the wiring circuit board 20 described subsequently, and electrically connect through routing wire interconnects 15 to appropriate points on the wiring circuit board 20. Each light emitting device 11 is joined to the light guide plate 1 with translucent bonding material 14, which is material that transmits light such as translucent resin.

A light emitting device 11 has, for example, a translucent substrate such as sapphire and a semiconductor stack configured as layers on top of the translucent substrate. The semiconductor stack includes a light emitting layer sandwiched between an n-type semiconductor layer and a p-type semiconductor layer, and has an n-electrode and p-electrode electrically connected to the n-type semiconductor layer and the p-type semiconductor layer respectively. The light emitting device 11 has the primary light emitting surface 11c, which is established, for example by the translucent substrate, disposed opposite the light guide plate, and has a pair of electrodes 11b on the electrode patterning surface 11d, which is the side opposite the primary light emitting surface 11c. The light emitting device 11 is preferably fabricated using nitride semiconductor material ($In_xAl_yGa_{1-x-y}N$, $0 \leq x$, $0 \leq y$, $x+y \leq 1$) making it possible to emit short wavelength light that can efficiently excite the wavelength shifting material.

There are no particular restrictions on the length, width, and height dimensions of the light emitting device 11. A semiconductor light emitting device 11 can be used that has plan-view length and width dimensions preferably less than or equal to 1000 μm, more preferably less than or equal to 500 μm, and even more preferably less than or equal to 250 μm. When this type of light emitting device is used in a liquid crystal display device with local dimming, high definition (resolution) images can be displayed. In addition, when light emitting devices 11 with length and width dimensions less than or equal to 500 μm are used, light emitting device 11 cost-effectiveness allows light emitting module 100 cost reduction. For light emitting devices with length and width dimensions less than or equal to 250 μm, the light emitting surface area is decreased and the relative amount of light emitted from the sides of the device increases. Specifically, since light emitted from this size light emitting device can easily take on a bat-wing configuration, these light emitting devices can be employed advantageously in the light emitting module 100 of the present embodiment, which minimizes the distance between light emitting devices 11 and the light guide plate 1 on which they are mounted.

The light emitting module light guide plate 1 is preferably provided with optically functional areas 2 that can diffuse and reflect light in the manner of optical lenses, and those optically functional areas 2 spread light from the light emitting devices 11 in lateral directions to make light emitted from the light guide plate 1 surface more uniform.

In the light emitting module 100 of the present embodiment, a plurality of alignment sections (in particular, recessed regions 1b) or optically functional areas 2 act as pre-formed alignment marks to align and mount a plurality of light emitting device units 10 on the light guide plate 1. This enables light emitting device 11 alignment on the light guide plate 1 to be performed with little difficulty. As a result, light from light emitting devices 11 can be accurately equalized in brightness to make a high-quality backlight light source with little brightness and color non-uniformity.

As described above, it is desirable to provide light emitting device 11 alignment sections on the surface opposite the surface provided with optically functional areas 2 in positions that correspond to optically functional area 2 locations. Specifically, alignment sections are established in positions that lie on top of optically functional areas 2 when viewed through the light guide plate 1 in plan-view. By forming recessed regions 1b and mounting wavelength shifting sections 12 of the light emitting device units 10 in those recessed regions 1b, light emitting devices 11 and optically functional areas 1b can be aligned in a straightforward manner. Alternatively, instead of disposing light emitting devices as light emitting device units in the recessed regions, wavelength shifting sections can be established by filling recessed regions with wavelength shifting material and attaching light emitting devices in those wavelength shifting sections. By forming wavelength shifting sections of material different from light guide plate 1 material inside alignment section recessed regions, fabrication equipment position recognition can identify those wavelength shifting sections and light emitting device alignment with the wavelength shifting sections can be performed with greater ease.

Further, by covering light emitting device 11 side-walls with the light reflecting material 16 to limit the direction of light emission, establishing wavelength shifting sections 12 inside recessed regions 1b to interface with light emitting device 11 primary light emitting surfaces 11c, and extracting light primarily from the wavelength shifting sections 12, each wavelength shifting section 12, which can diffuse incident light internally, can be considered a "light emitting section." From this viewpoint, as long as the light emitting device 11 is within an opposing wavelength shifting section 12 as viewed in plan-view, the effects of light emitting device 11 misalignment can be reduced.

The light emitting device 11 viewed in plan-view can be of any shape. For example, use of square or rectangular light emitting devices is preferable. In the case of a high definition liquid crystal display device, the number of light emitting devices 11 used is greater than or equal to 1000 and light emitting device 11 mounting becomes a critical process step. When rectangular light emitting devices are used, even if some of the light emitting devices are rotationally miss-mounted (e.g. rotated ±90°) during the mounting process, those rotated rectangular light emitting devices can be easily visually identified when viewed in plan-view. Further, since the p-electrode and n-electrode can be formed with separation on a rectangular light emitting device, routing wire interconnects 15 described subsequently can be can be formed in a straightforward manner. In contrast, use of square (viewed in plan-view) light emitting devices benefits from the ability to easily manufacture small light emitting devices in quantity. The density of light emitting devices 11 (pitch of the light emitting device array on a light guide plate 1) can be, for example, on the order of 0.05 mm-20 mm between light emitting devices 11, and preferably on the order of 1 mm-10 mm between light emitting devices 11.

The plurality of light emitting devices 11 is disposed in a multi-row, multi-column array, when the light guide plate 1 is viewed in plan-view. Preferably as shown in FIG. 2A, the light emitting devices 11 are arranged in two orthogonal (perpendicular) directions (i.e. along an x-direction and a y-direction) in a two-dimensional array. The pitch of the light emitting device 11 array in the x-direction (px) and the pitch in the y-direction (py) can be the same as shown in FIG. 2A, or the pitch can be different in different directions. The two directions of the light emitting device 11 array can also be non-orthogonal. Further, the pitch in the x-direction and the pitch in the y-direction are not necessarily uniform in a given direction, and the pitch interval can vary along a given direction. For example, light emitting devices 11 can be arrayed such that pitch intervals become wider when moving from the center of the light guide plate 1 towards the perimeter. Here, the pitch interval between light emitting devices 11 is the distance between their respective optical axes.

Widely known semiconductor light emitting devices can be used as the light emitting device 11. In the present embodiment, the light emitting diode is taken as an example of the light emitting device 11. The light emitting device 11 can emit, for example, blue light. Further, when combined with wavelength shifting material as a light emitting device unit 10, that unit can be used as a source of white light. Light emitting devices that emit different colors can also be used as a plurality of light emitting devices 11. For example, the light emitting module 100 can be assembled with light emitting devices that emit red, green, and blue light, and that red, green, and blue light can be mixed to radiate white light.

a device that emits light of a given (arbitrary) wavelength can be selected as the light emitting device 11. For example, as a device that emits blue or green light, a light emitting device that employs nitride system semiconductors (In$_x$Al$_{1-y}$Ga$_{1-x-y}$N, 0≤x, 0≤y, x+y≤1) or GaP can be used. As a device that emits red light, a light emitting device that includes semiconductor material such as GaAlAs and AlInGaP can be used. In addition, semiconductor light emitting devices made with other materials can be used as well. A variety of light emission wavelengths can be selected based on semiconductor layer material and crystallinity mix. Composition, light emission color, size, and quantity of the light emitting devices used can be selected as required by the application.

Translucent Adhesive 17

Translucent adhesive 17 joins the primary light emitting surface 11c of a light emitting device 11 to the surface of a wavelength shifting section 12. As shown in FIG. 3E, translucent adhesive 17 covers parts of the light emitting device 11 side-walls and part of the wavelength shifting section 12. The outer sides of the translucent adhesive 17 preferably form inclined surfaces that spread out from the sides of the light emitting device 11 towards the wavelength shifting section 12, and more preferably are curved surfaces that project up the sides of the light emitting device 11 (concave meniscus shape). In addition, when viewed in plan-view from the first primary surface 1c of the light guide plate 1, the extent of translucent adhesive 17 application on the wavelength shifting section 12 is preferably limited to areas within the outer edges of the wavelength shifting section 12. With this configuration, light shining out the side-walls of the light emitting device 11 can more efficiently enter the wavelength shifting section 12, and consequently light extraction efficiency can be improved. Translucent adhesive 17 can also reside between the primary light emitting surface 11c of the light emitting device 11 and the wavelength shifting section 12. By including, for example, diffusing (dispersing) agent in the translucent adhesive 17, this configuration allows light emitted from the primary light emitting surface 11c of the light emitting device 11 to enter the wavelength shifting section 12 after being diffused by the translucent adhesive 17, and this can reduce brightness non-uniformity. Incidentally, the same material can be used as translucent adhesive 17 and as the translucent bonding material 14 described subsequently.

Light Reflecting Material 16

With the light emitting device 11 joined to the wavelength shifting section 12, a light emitting device unit 10 may have side-walls of the light emitting device 11 covered by the light reflecting material 16. Specifically, light reflecting material 16 may cover regions of the light emitting device 11 side-walls not covered by translucent adhesive 17 and may cover the outside surfaces of the translucent adhesive 17. The light reflecting material 16 has exceptional light reflecting properties and preferably is white resin that is translucent resin including additives such as white particulates that reflect light. By covering surfaces other than the primary light emitting surface 11c of the light emitting device 11 in a light emitting device unit 10 with light reflecting material 16, light escaping from parts of the light emitting device 11 other than the primary light emitting surface 11c can be suppressed. Namely, light reflecting material 16 reflects light shining from light emitting device 11 side-walls and from the electrode patterning surface 11d to effectively radiate light from the first primary surface 1c of the light guide plate 1. This can improve the light extraction efficiency of the light emitting module 100.

White resin with a reflectivity (with respect to light emitted from the light emitting device 11) greater than or equal to 60% and preferably greater than or equal to 90% is suitable for use as light reflecting material 16. Preferably, the light reflecting material 16 is a resin that includes white particulate pigment (coloring). In particular, silicone resin that includes inorganic white particulates such as titanium dioxide is desirable.

The light reflecting material 16 may contact at least part of the light emitting device 11 side-walls, may surround the light emitting device 11 to embed it in light reflecting material 16, and may expose light emitting device 11 electrodes 11b from the upper surface. For example, the light reflecting material 16 contacts the wavelength shifting section 12 and outer walls of the light reflecting material 16 are approximately co-planar with outer walls of the wavelength shifting section 12. However, a configuration where outer walls of the wavelength shifting section 12 extend laterally beyond the outer walls of the light reflecting material 16 is also suitable. In that case, when the light emitting device unit 10 is bonded to the light guide plate 1 using translucent bonding material 14 described subsequently, that bond is made stronger and that configuration is preferable. The light reflecting material 16 may be joined with the light emitting device 11 and the wavelength shifting section 12 in a single unit structure, which is the light emitting device unit 10. The light reflecting material 16 may be disposed on the light guide plate 1 as a part of the light emitting device unit 10.

Translucent Bonding Material 14

The light emitting device unit 10 can be joined to the light guide plate 1 with translucent bonding material 14. In the present embodiment, translucent bonding material 14 contacts inside surfaces of a recessed region 1b and outer (side-wall) surfaces of a light emitting device unit 10. Translucent bonding material 14 also contacts parts of the light reflecting material 16 that extends upward outside the recessed region 1b. Said differently, translucent bonding material 14 is disposed in a manner that covers light emitting device unit 10 outer side-walls and straddles regions that transition from wavelength shifting section 12 to the light reflecting material 16. This efficiently directs light shining laterally from the light emitting device unit 10 into the translucent bonding material 14 and can improve the light emission efficiency of the light emitting module 100. As shown in FIG. 2B for the case where translucent bonding material 14 covers side-walls of the light emitting device unit 10, it is desirable to form the translucent bonding material 14 with a cross-section shape that spreads out towards the light guide plate 1. The upper surface of translucent bonding material 14 in the figures is a gently inclining surface. This can efficiently redirect light shining laterally from the light emitting device 11 towards the light guide plate 1. Further, translucent bonding material 14 can also be disposed between the wavelength shifting section 12 and the bottom of the recessed region 1b.

The light guide plate 1 shown in FIG. 2B has recessed regions 1b with inclined inside surfaces that slope downward from recessed region perimeter edges towards the inside. Accordingly, translucent bonding material 14 that fills a recessed region 1b spreads out and hardens in a given stable shape. In particular, this has the characteristic that surface shrinking can be effectively prevented when the translucent bonding material 14 hardens. Further, By covering regions that straddle outer side-walls of the wavelength shifting section 12 and the light reflecting material 16, translucent bonding material 14 that fills a recessed region 1b rises upward around the perimeter light emitting device unit 10. Namely, when viewed in cross-section, translucent bonding material 14 has an upper surface that inclines and has an upward bulging center region. This shape can reflect light, which passes through the translucent bonding material 14 and is incident on an inclined upper surface, in a uniform manner towards the light emitting surface. In addition, areas where translucent bonding material 14 inclined surfaces are formed can be made wide to reflect a significant amount of light and reduce brightness non-uniformity.

Thermosetting resin materials such as epoxy resin and silicone resin can be used as the translucent bonding material 14. Light transmittance of the translucent bonding material 14 is greater than or equal to 60% and preferably greater than or equal to 90%. The translucent bonding material 14 can include light diffusing material or light reflecting additives such as white particulates. Or, the translucent bonding material 14 can be made up of translucent resin material only without including any light diffusing material or white particulates.

For the case where the light emitting device 11 is provided with a translucent substrate, it is desirable for translucent bonding material 14 to cover at least part of the device side-walls. Light shining from the semiconductor light emitting layer that propagates through the translucent substrate and exits laterally can be directed to upper regions of the translucent bonding material 14 by this configuration. It is preferable for the translucent bonding material 14 to have sufficient height to cover at least half of the translucent substrate side-walls, and it is more preferable for the translucent bonding material 14 to extend to contact edges between light emitting device 11 side-walls and the electrode patterning surface 11d.

Encapsulant Material 13

The encapsulant material 13 encapsulates side-walls of the light emitting device units 10, the second primary surface 1d of the light guide plate 1, and the surfaces of the translucent bonding material 14. This can reinforce the structure of the light emitting device units 10 and light guide plate 1. Further, by using light reflecting material for the encapsulant material 13, light emission from the light emitting device units 10 can be effectively directed into the light guide plate 1. By serving the dual purposes of protecting the light emitting devices 11 and reflecting light from the light guide plate 1 surface opposite the light emitting surface, the encapsulant material 13 contributes to making the light emitting module 100 thin.

The encapsulant material 13 is preferably a light reflecting material. Light reflecting encapsulant material 13 has a reflectivity (with respect to light emitted from the light emitting devices 11) greater than or equal to 60% and preferably greater than or equal to 90%. Light reflecting encapsulant material 13 is preferably resin material that includes white pigment. In particular, silicone resin that includes titanium dioxide is desirable. By using inexpensive raw material such as titanium dioxide in the encapsulant material 13, which is used in relatively large quantity to cover an entire surface of the light guide plate 1, the light emitting module 100 can be made inexpensive.

Routing Wire Interconnects 15

The light emitting module 100 can be provided with routing wire interconnects 15 that electrically connect with electrodes 11b of the plurality of light emitting devices 11. Routing wire interconnects 15 can be formed over the upper surface of the encapsulant material 13 (and upper surfaces of light emitting device units 10) on the surface of the light guide plate 1 opposite the first primary surface 1c. By establishing routing wire interconnects 15, for example, light emitting devices 11 can be connected together and circuitry required for liquid crystal display device 1000 functions such as local dimming can be easily configured. Routing wire interconnects 15 can be formed as shown in FIGS. 4E-4H. For example, light emitting device 11 positive and negative electrodes 11b are exposed from the upper surface of the encapsulant material 13, a metal layer 15a is formed on top of the light emitting device 11 electrodes 11b and encapsulant material 13, and metal layer 15a material is locally removed by methods such as laser ablation to form the routing wire interconnects 15.

Wiring Circuit Board 20

Figure 4B:
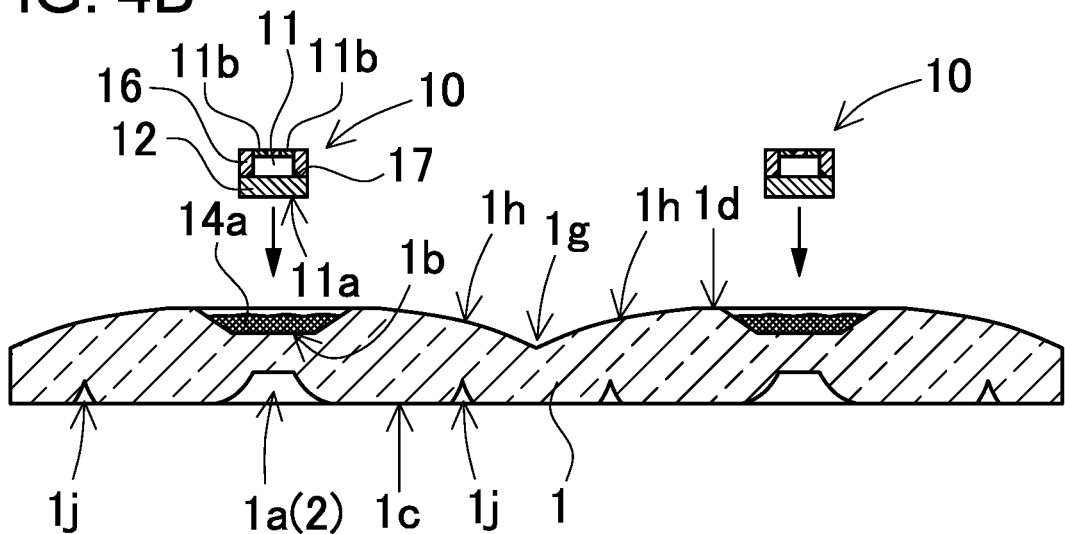
FIG. 4B is an enlarged cross-section schematic showing an example of a light emitting module process step according to an embodiment of the present disclosure.
Figure 4C:
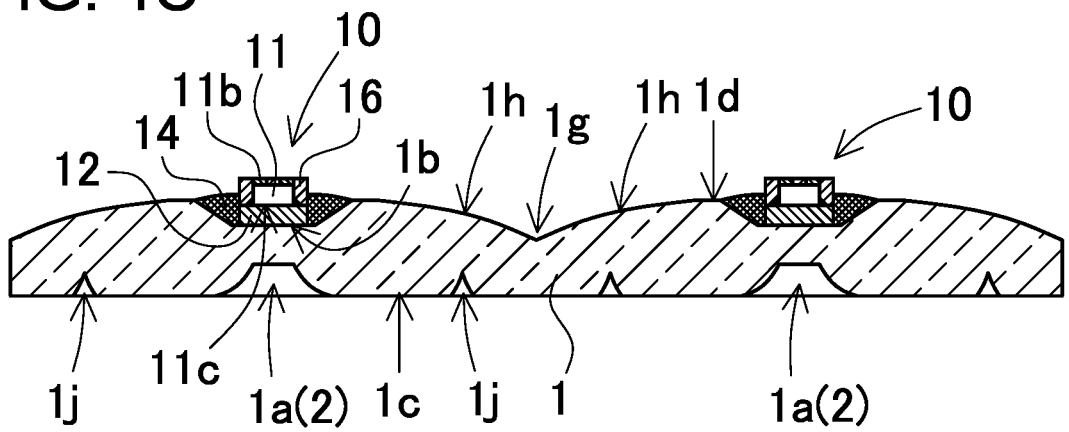
FIG. 4C is an enlarged cross-section schematic showing an example of a light emitting module process step according to an embodiment of the present disclosure.
Figure 4D:
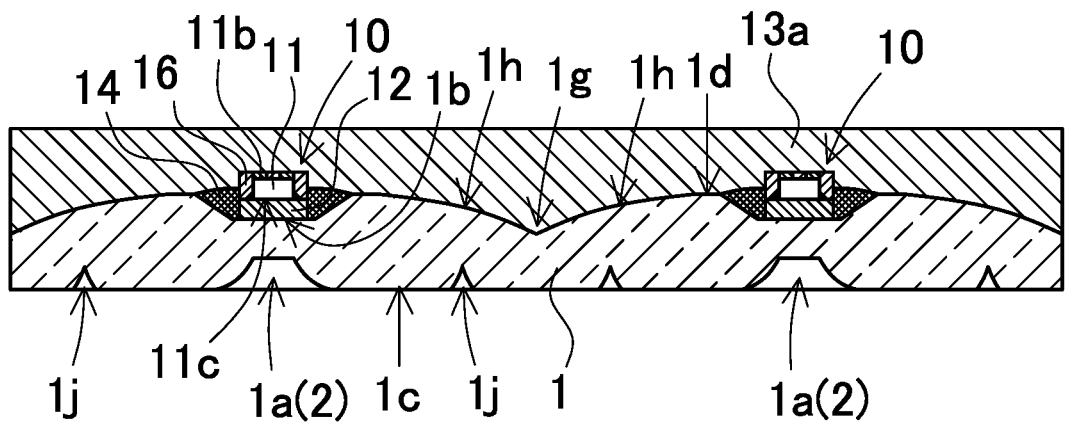
FIG. 4D is an enlarged cross-section schematic showing an example of a light emitting module process step according to an embodiment of the present disclosure.
Figure 4E:
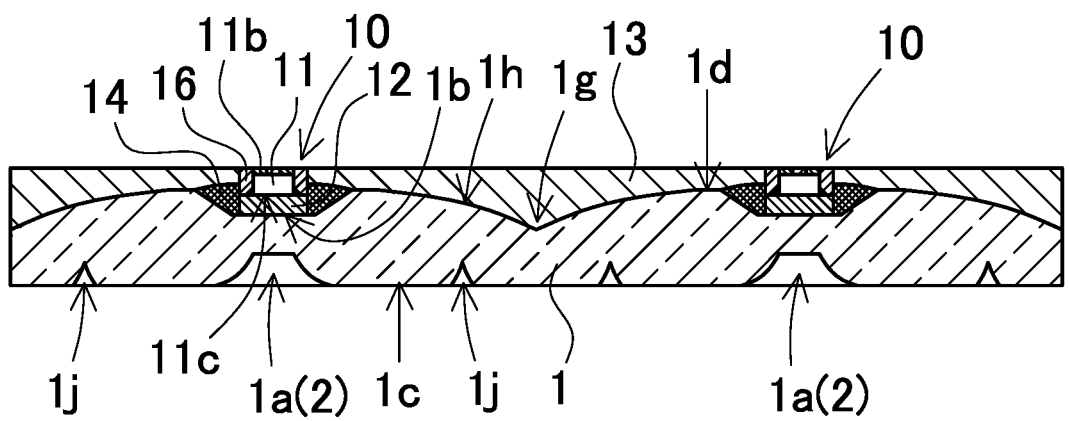
FIG. 4E is an enlarged cross-section schematic showing an example of a light emitting module process step according to an embodiment of the present disclosure.
Figure 4F:
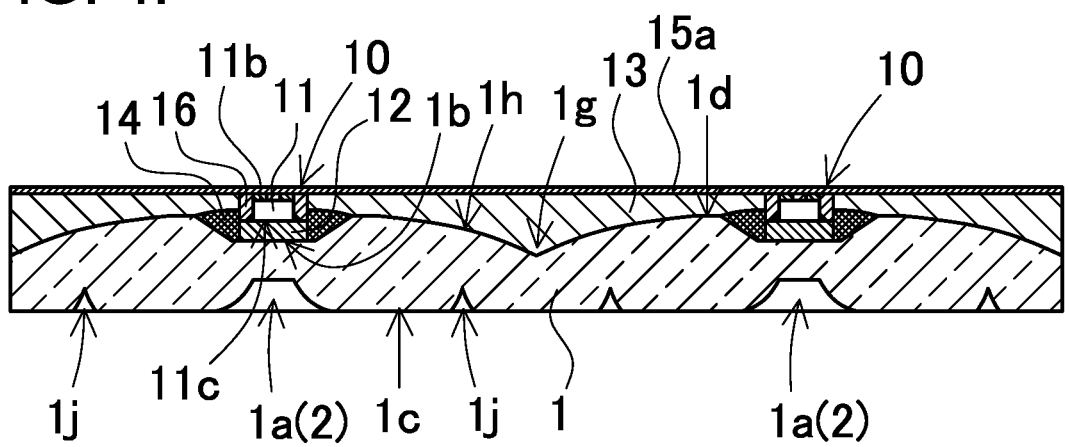
FIG. 4F is an enlarged cross-section schematic showing an example of a light emitting module process step according to an embodiment of the present disclosure.
Figure 4G:
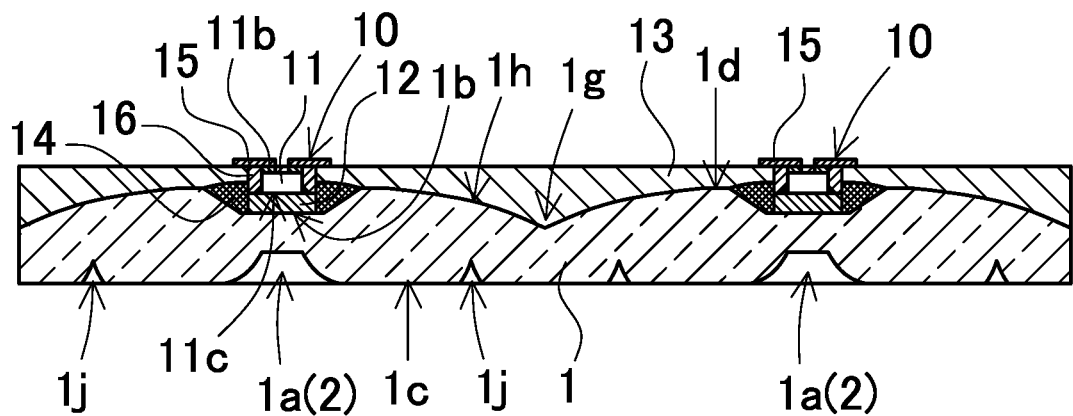
FIG. 4G is an enlarged cross-section schematic showing an example of a light emitting module process step according to an embodiment of the present disclosure.
Figure 4H:
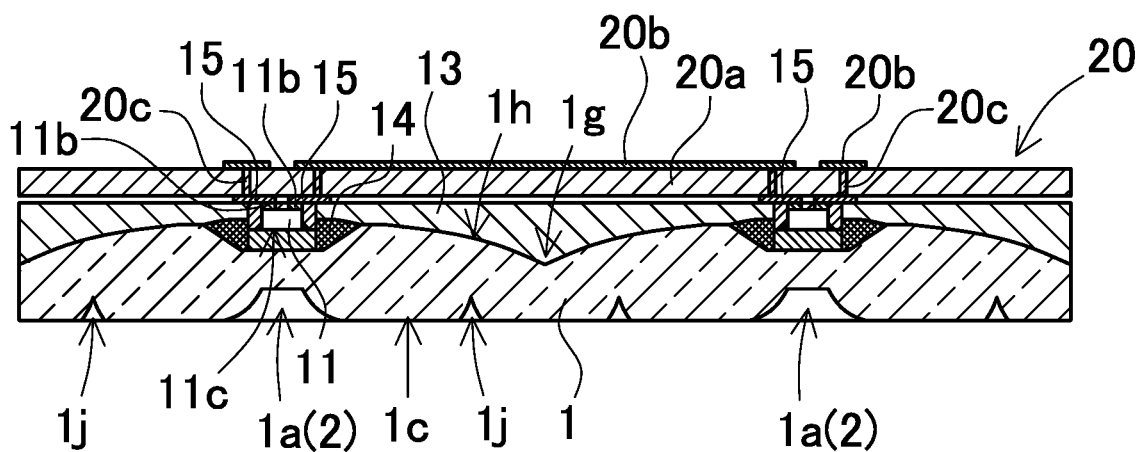
FIG. 4H is an enlarged cross-section schematic showing an example of a light emitting module process step according to an embodiment of the present disclosure.

As shown in FIG. 4H, the light emitting module 100 of the present disclosure can have a wiring circuit board 20. This allows complex circuitry required for functions such as local dimming to be implemented in a straightforward manner. After mounting light emitting devices 11 on the light guide plate 1 and forming encapsulant material 13 and routing wire interconnects 15, the wiring circuit board 20, which has its own interconnect layer 20b, can be joined to light emitting device electrodes 11b and routing wire interconnects 15. By forming routing wire interconnects 15, which connect to the light emitting devices 11, with planar area greater than that of the light emitting device 11 electrodes 11b, electrical connection of the wiring circuit board 20 with the light emitting devices 11 can be easily executed.

The wiring circuit board 20 is a circuit board that includes insulating board material 20a and an interconnect layer 20b that electrically connects with the light emitting devices 11. For example, the wiring circuit board 20 is formed with a plurality of via holes, which pass through the insulating board material 20a and are filled with conducting material 20c, and an interconnect layer 20b on the insulating board material 20a surface that electrically connects with the conducting material 20c.

The wiring circuit board 20 can be made of a wide range of materials. For example, ceramics or resins can be used. From the standpoint of low cost and ease of fabrication, resin material can be selected as the insulating board material 20a. Resins such as phenol resin, epoxy resin, polyimide resin, bismaleimide triazine (BT) resin, polyphthalamide (PPA), polyethylene terephthalate (PET), unsaturated polyester, glass epoxy and other composite materials should be mentioned as candidates. The wiring circuit board 20 can be a flexible or rigid circuit board. In the light emitting module 100 of the present embodiment, light emitting device 11 locations relative to the light guide plate 1 are set prior to wiring circuit board 20 addition. Accordingly, even if materials that can expand or warp due to effects such as thermal stress are used as the board material 20a, positional misregistration between the light emitting devices 11 and the light guide plate 1 cannot occur easily. Consequently, low-cost materials such as glass epoxy or thin substrate material can be suitably employed.

The interconnect layer 20b is, for example, a conducting film (conducting layer) formed on the board material 20a that electrically connects to the light emitting devices 11. Interconnect layer 20b material is preferably high thermal conductivity material. Candidates for this type of interconnect layer material include conductive material such as copper. The interconnect layer 20b can be formed by methods such as metal plating, conductive paste application, and printing methods, and interconnect layer 20b thickness can be, for example, on the order of 5 μm-50 μm.

The wiring circuit board 20 can be joined to the light guide plate 1 by any of various methods. For example, adhesive sheet can be disposed between the surface of the encapsulant material 13 on the backside of the light guide plate 1 and the wiring circuit board 20, and pressure applied for attachment. Electrical connection between the interconnect layer 20b of the wiring circuit board 20 and light emitting devices 11 can also be made by various techniques. For example, pressure and heat can be applied to metal filling the via holes, which is the conducting material 20c, to fuse that metal with the routing wire interconnects 15.

The wiring circuit board 20 can also have a multi-layer laminated structure. For example, a metal plate with insulating layers established on the surfaces can be used as the wiring circuit board 20. In addition, the wiring circuit board 20 can also be a thin-film transistor (TFT) circuit board.

Light Emitting Module 100 Fabrication Process

The following describes an example of the processing methods for fabricating the light emitting module of the present embodiment. First, light emitting device unit 10 preparation is described. FIGS. 3A to 3E show an example of the process steps to form the light emitting device unit 10. In the process step shown in FIG. 3A, the wavelength shifting section 12, which covers the light emitting device 11 primary light emitting surface 11c, is formed. In this step, wavelength shifting material of approximately uniform thickness is formed (to establish a large un-cut wavelength shifting section 12) on the surface of a "base-sheet 41," which is disposed in a detachable manner on a substrate plate 42.

Figure 3A:
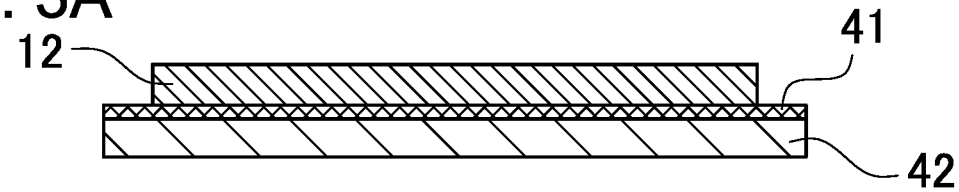
FIG. 3A shows an example of a process step for forming a light emitting device unit according to an embodiment of the present disclosure.
Figure 3B:
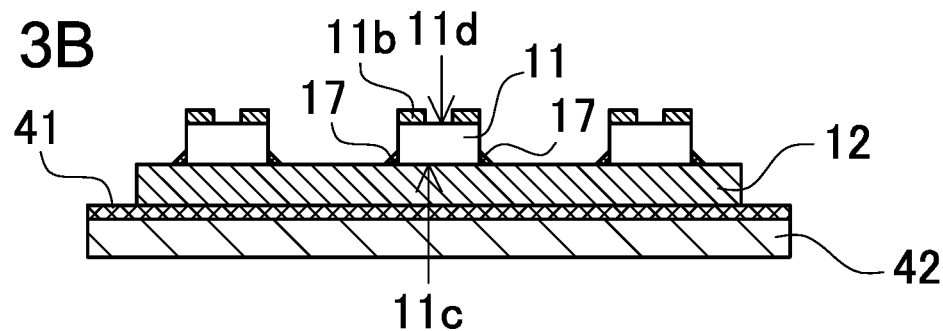
FIG. 3B shows an example of a process step for forming a light emitting device unit according to an embodiment of the present disclosure.

In the process step shown in FIG. 3B, light emitting devices 11 are attached to the wavelength shifting section 12. The primary light emitting surface 11c side of each light emitting device 11 is attached to the wavelength shifting section 12. Light emitting devices 11 are attached to the wavelength shifting section 12 at prescribed intervals. Each light emitting device 11 is attached to the wavelength shifting section 12 with translucent adhesive 17. Translucent adhesive 17 is applied to the upper surface of the wavelength shifting section 12 and/or the primary light emitting surface 11c of the light emitting device 11 to join the light emitting device 11 and wavelength shifting section 12. At this time, as shown in FIG. 3B, translucent adhesive 17 rises up the side-walls of the light emitting device 11 and covers part of the light emitting device 11 side-walls. Translucent adhesive 17 can also reside between the wavelength shifting section 12 and the primary light emitting surface 11c of the light emitting device 11. As shown in FIG. 3E, the interval between light emitting devices 11 is set to a dimension that allows the light emitting devices 11 to be separated by cutting and forms wavelength shifting sections 12 with given size perimeters.

Figure 3C:
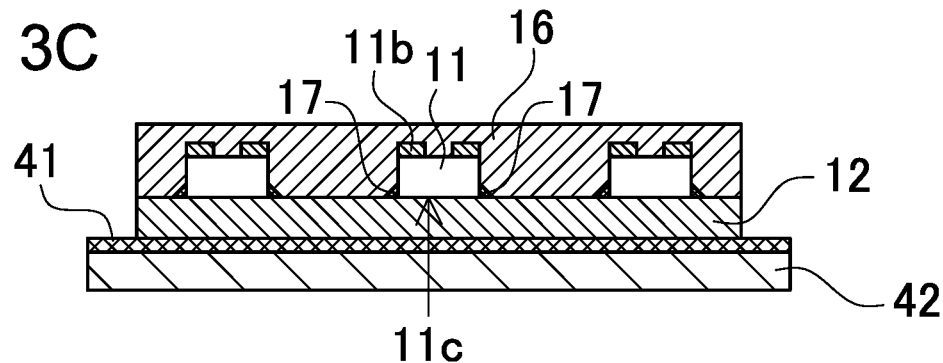
FIG. 3C shows an example of a process step for forming a light emitting device unit according to an embodiment of the present disclosure.

In the process step shown in FIG. 3C, a light reflecting material 16 is formed in a manner that embeds the light emitting devices 11. The light reflecting material 16 is preferably white resin. The light reflecting material 16 is disposed on top of the wavelength shifting section 12 and hardens to embed the light emitting devices 11. The light reflecting material 16 is formed with a thickness that completely embeds the light emitting devices 11, and as shown in FIG. 3C, has a thickness that covers light emitting device 11 electrodes 11b.

Figure 3D:
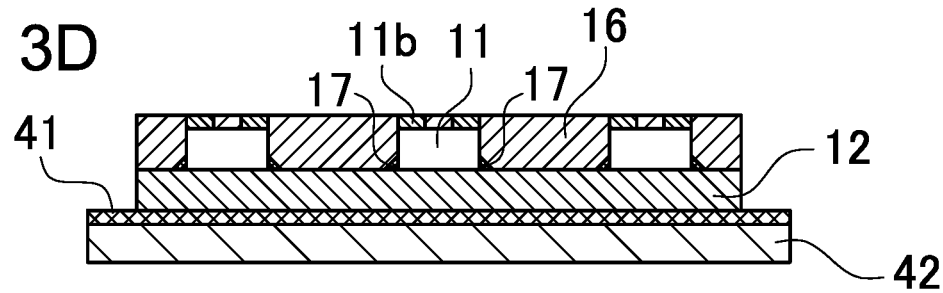
FIG. 3D shows an example of a process step for forming a light emitting device unit according to an embodiment of the present disclosure.
Figure 3E:
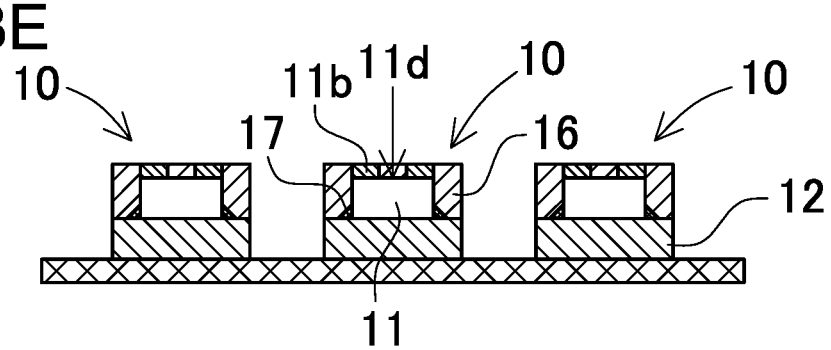
FIG. 3E shows an example of a process step for forming a light emitting device unit according to an embodiment of the present disclosure.

In the process step shown in FIG. 3D, a portion of the solidified light reflecting material 16 is removed to expose light emitting device 11 electrodes 11b. Here, an additional metal layer can be formed to cover the electrodes 11b. Formation of an additional metal layer can protect the electrodes 11b.

In the process step shown in FIG. 3E, the light reflecting material 16 and wavelength shifting material are cut to singularize light emitting device units 10. Each singularized (diced) light emitting device unit 10 has a wavelength shifting section 12 joined to the light emitting device 11, has the light reflecting material 16 established around the light emitting device 11 periphery, and has electrodes 11b exposed from the upper surface of the light reflecting material 16. In preparing the light emitting device unit 10, all the process steps described above can be performed or only certain steps can be performed. Alternatively, light emitting device units can be purchased in ready-made form.

Each light emitting device unit 10 fabricated by the process steps described above is mounted in a light guide plate 1 recessed region 1b by the process steps shown in FIG. 4A-4C.

First, the light guide plate 1 is prepared as shown in FIG. 4A. The light guide plate 1 is made of material such as polycarbonate, recessed regions 1a are formed to implement optically functional areas 2 and together with reflecting grooves 1j are established on the first primary surface 1c, recessed regions 1b with approximately rectangular openings are provided to accept and align the wavelength shifting section 12 of each light emitting device unit 10 on the second primary surface 1d, and reflecting depressions 1g are established in cell boundary regions 7 also on the second primary surface 1d. Since the light emitting module 100 introduces light from light emitting devices 11 into the light guide plate 1 through wavelength shifting sections 12, when viewed in plan-view, the outline of the optically functional areas 2 is made larger than the wavelength shifting sections 12, which act as light emitting device light emitting surfaces 11a. Optically functional areas 2 are implemented by hollow recessed regions 1a formed in the light guide plate 1, and the inside surfaces of each optically functional area 2 are established as inclined surfaces 1x. The inclined surface 1x inclines towards the light emitting device 11 approaching the center of the recessed region 1a and has a shape such that the angle of inclination γ (refer to FIG. 2B) gradually increases approaching the center of the recessed region 1a. Further, a planar region 1y is established at the center (or base) of each recessed region 1a. The planar region 1y at the center of a recessed region 1a is established parallel to the light emitting surface 11a of the light emitting device. A light guide plate 1 with planar regions 1y in optically functional area 2 recessed regions 1a increases the thickness of the thinnest part of the light guide plate 1, which is between recessed regions 1a and wavelength shifting sections 12, and this can improve light guide plate 1 robustness. The planar region 1y of each optically functional area 2 is disposed in line with the optical axis of a light emitting device 11. The light guide plate 1 has the center of each optically functional area 2 recessed region 1a and the center of each wavelength shifting section 12 recessed region 1b disposed on the optical axis of a light emitting device 11, and this disposes each optically functional area 2 recessed region 1a at the center of a wavelength shifting section 12, which is on the optical axis of a light emitting device 11. Further, recessed regions 1a can, for example, be provided with a light reflecting material (e.g. reflecting film such as a metal layer or white resin) formed by a method such as potting.

A light emitting device unit 10 is mounted in each of the light guide plate 1 recessed regions 1b described above. As shown in FIG. 4B, the light emitting device unit 10 is partially immersed in translucent bonding material in liquid form 14a, which is applied to coat the inside of the recessed region 1b. Specifically, the wavelength shifting section 12 of the light emitting device unit 10 is disposed on the bottom surface of the recessed region 1b. In addition, part of the translucent bonding material 14 bulges upward outside of the recessed region 1b. The light emitting device unit 10 is disposed such that the center of the wavelength shifting section 12 and the center of the recessed region 1b have the same location (viewed in plan-view), and the translucent bonding material 14 is hardened to join the light emitting device unit 10 to the light guide plate 1 in that configuration.

Here, the bottom surface of the recessed region 1b is larger than the bottom surface of the light emitting device unit 10 (viewed in plan-view). Accordingly, when the light emitting device unit 10 is mounted in the recessed region 1b, there is space between the inner side-walls of the recessed region 1b and the outer side-walls of the light emitting device unit 10. In the recessed regions 1b shown in the figures, inner side-walls are inclined surfaces 1m, and space is formed between those inclined surfaces and the outer side-walls of each light emitting device unit 10. Unhardened translucent bonding material 14, which is applied inside of the recessed regions 1b, fills those spaces.

By adjusting the amount of translucent bonding material in liquid form 14a applied to (partially) fill each recessed region 1b, translucent bonding material 14 can be pushed up from the space between the inner side-walls of the recessed region 1b and the outer side-walls of the light emitting device unit 10 to bulge above (outside) the recessed region 1b. As shown in FIGS. 4C and 2B, translucent bonding material 14 is pushed upward from the recessed region 1b and rises to locations that contact and cover parts of the light reflecting material 16 in the light emitting device unit 10. Translucent bonding material 14 can also extend laterally to points contacting the second primary surface 1d and can cover parts of the second primary surface 1d. When viewed in cross-section, this translucent bonding material 14 upper surface is configured as an inclined surface that slopes outward from upper parts of the light emitting device unit 10. The angle formed by the inclined surface of the translucent bonding material 14 and an outer side-wall of the light emitting device unit 10 light reflecting material 16 is less than or equal to 90°, preferably 5°-90°, and more preferably 45°-85°.

The amount of translucent bonding material in liquid form 14a applied to (partially) fill each recessed region 1b is set such that translucent bonding material 16 covering sides of the light emitting device unit 10 (after mounting the light emitting device unit 10 in the recessed region 1b) is above the second primary surface 1d of the light guide plate 1. Specifically, the amount of translucent bonding material liquid 14a can be an amount that will bulge out of (overflow from) the recessed region 1b.

Next, as shown in FIG. 4D, encapsulant material in unfinished form 13a is established in a manner embedding the second primary surface 1d of the light guide plate 1, light emitting device units 10, and translucent bonding material 14. Raw material for the encapsulant material is a light reflecting substance that is a mixture of titanium dioxide and silicone resin. The unfinished encapsulant material 13a is established by methods such as transfer molding, potting, printing, or spray application. At this time unfinished encapsulant material 13a is formed as a thick layer that completely covers upper surfaces of the light emitting device 11 electrodes 11b. Subsequently, as shown in FIG. 4E, the encapsulant material (unfinished layer 13a) is partially removed to expose the light emitting device 11 electrodes 11b and establish the encapsulant material 13 as a finished layer. Methods such as grinding or polishing (with a grind stone or polishing abrasive), or sand blasting can be used to partially remove encapsulant material 13a.

Next, as shown in FIG. 4F, a metal layer 15a of Cu/Ni/Au (in order from the top of the encapsulant material 13) is formed over essentially the entire upper surfaces of the encapsulant material 13 and light emitting device 11 electrodes 11b by a method such as sputtering.

Next, as shown in FIG. 4G, the metal layer 15a is patterned by laser ablation to form the routing wire interconnects 15.

Next, as shown in FIG. 4H, the interconnect layer 20b of a separately prepared wiring circuit board 20 is joined by compression to the routing wire interconnects 15 with an intervening adhesive sheet. At this time, by applying pressure and heat to parts of the interconnect layer 20b such as the conducting material 20c filling the via holes, partial melting electrically connects the interconnect layer 20b to the routing wire interconnects 15. Accordingly, the light emitting module 100 of the present embodiment can be realized by this processing sequence.

The (plurality of) light emitting devices 11 can be connected by circuitry that can activate each individual device. Or, the light guide plate 1 can be divided into a plurality of regions, and the light emitting devices 11 mounted in each region can be treated as a group of devices. Light emitting devices 11 in a given group can be electrically connected in series or parallel as a single circuit, and a plurality of these light emitting device groups can be established. By dividing the light emitting devices 11 into local groups, a light emitting module can be made that supports local dimming.

Figure 6A:
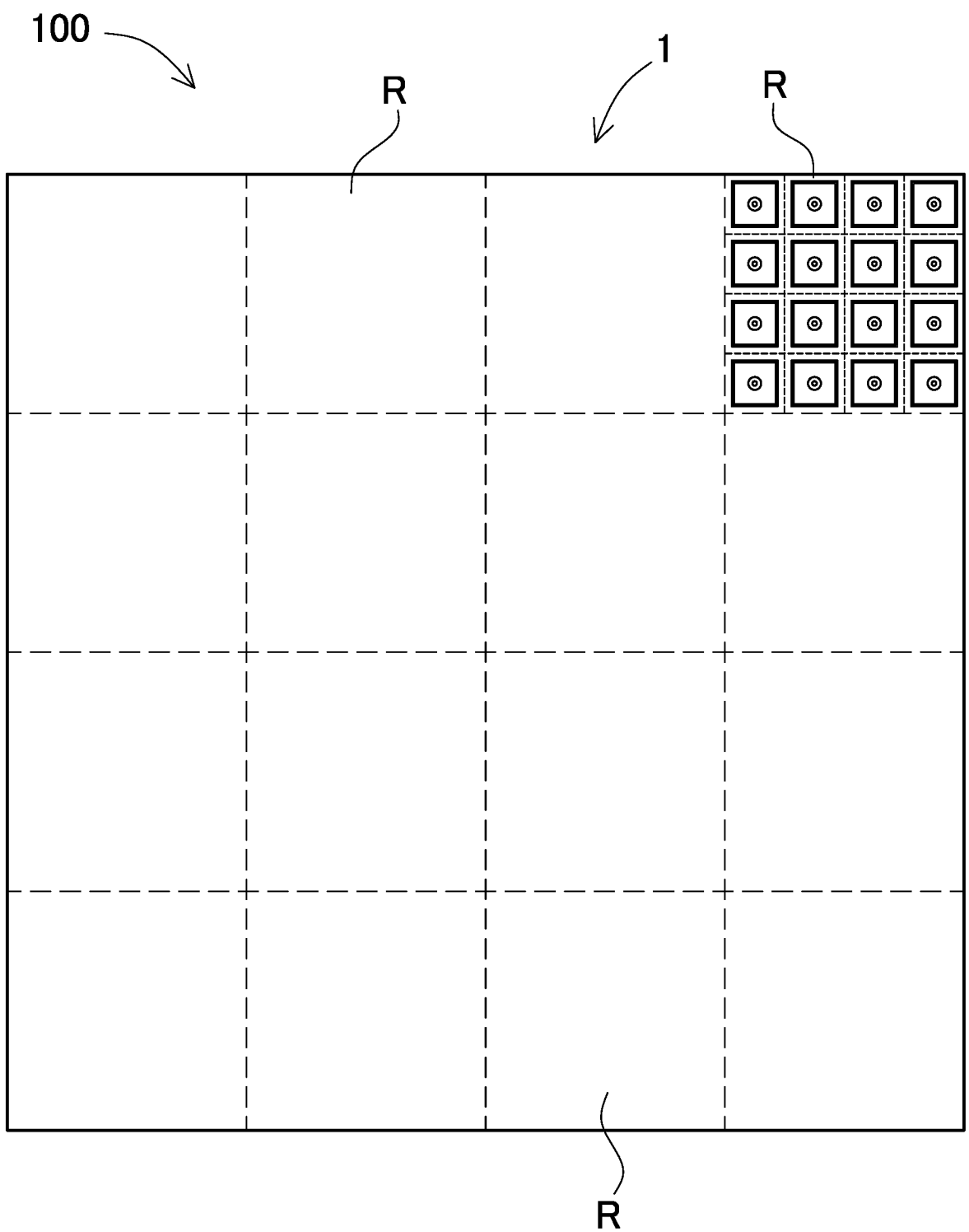
FIG. 6A is a schematic plan-view of a light emitting module according to an embodiment of the present disclosure.
Figure 6B:
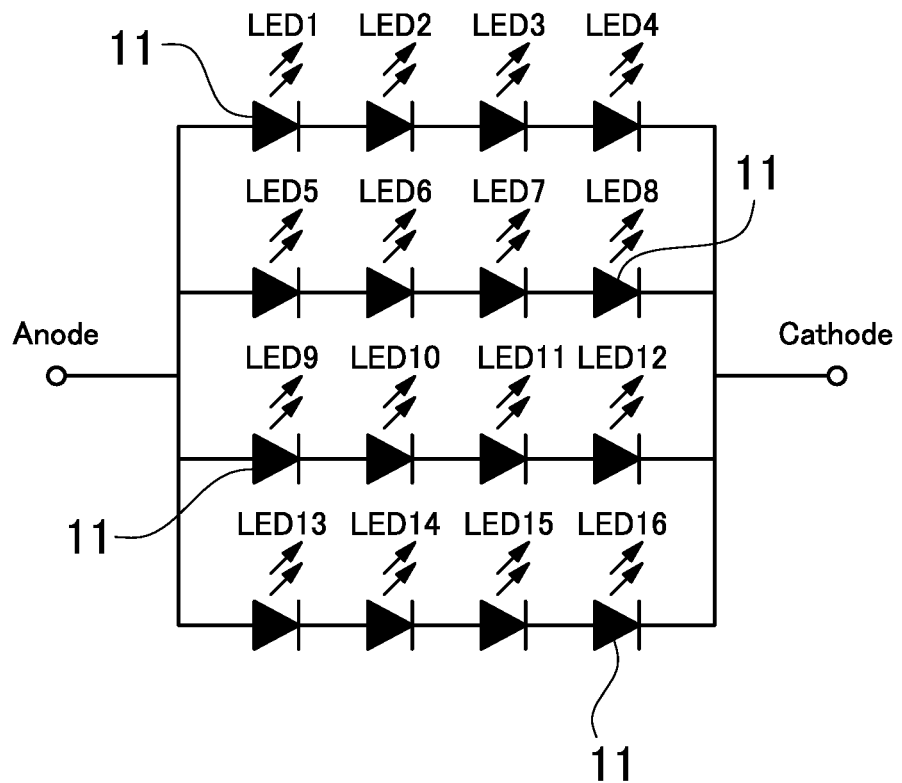
FIG. 6B is a circuit diagram showing circuit structure of a light emitting module according to an embodiment of the present disclosure.

An example of this type of division into light emitting device groups is shown in FIGS. 6A and 6B. In the example shown in FIG. 6A, the light guide plate 1 is divided into 4 rows and 4 columns to form 16 regions R. One of these regions R contains 16 light emitting devices 11 in 4 rows and 4 columns. As shown in FIG. 6B, those 16 light emitting devices 11 can be electrically connected, for example, as 4 parallel connections of 4 series connected devices.

One of the light emitting modules 100 of the present embodiment can be used as backlighting for one liquid crystal display device 1000. Alternatively, a plurality of light emitting modules 100 can be linked together and used as the backlight for a single liquid crystal display device 1000. Compared to manufacturing and inspecting a single large light emitting module 100 mounted with many light emitting devices 11, yield can be improved by producing multiple small light emitting modules 100 instead.

A single light emitting module 100 can be joined with a single wiring circuit board 20, or a plurality of light emitting modules 100 can be joined with a single wiring circuit board 20. The later allows the terminals for external electrical connection to be unified (e.g. in connectors 20e) and makes it unnecessary to provide a connector for each light emitting module. Accordingly, liquid crystal display device 1000 structure can be simplified.

Further, a plurality of wiring circuit boards 20 each connected to a plurality of light emitting modules 100 can be linked together as the backlighting for a single liquid crystal display device 1000. Here, the plurality of wiring circuit boards 20 can be mounted, for example, in a frame and the connectors 20e can be used for external electrical connection.

Figure 7:
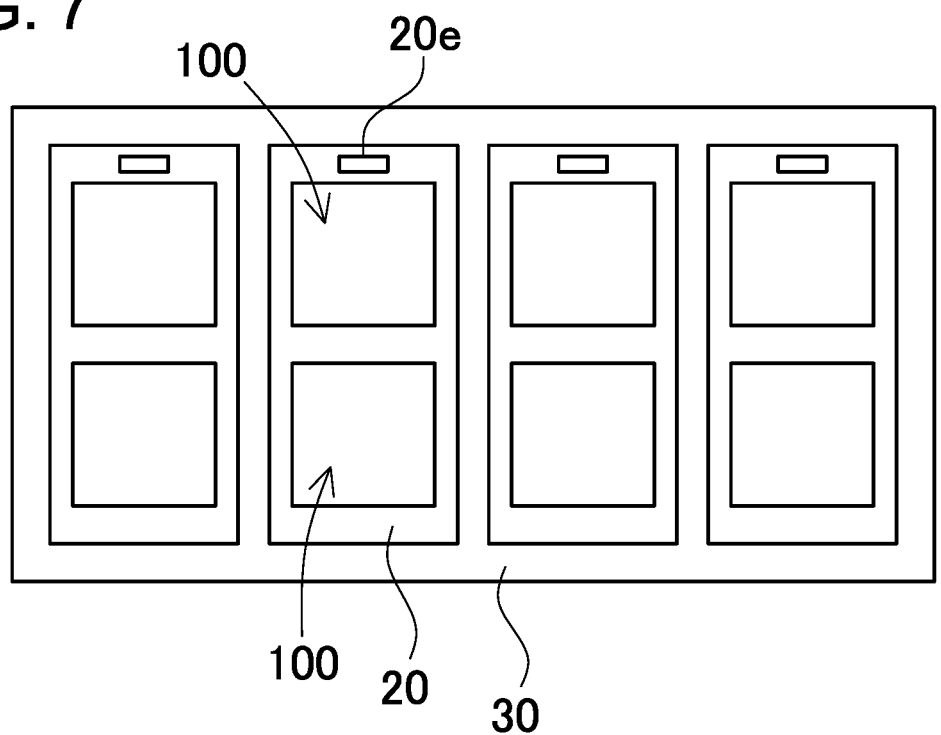
FIG. 7 is a schematic plan-view of a light emitting module embodiment used in a liquid crystal display device.

An example of a liquid crystal display device provided with a plurality of light emitting modules 100 in this configuration is shown in FIG. 7. In this example, two light emitting modules 100 are joined with each wiring circuit board 20 and four wiring circuit boards 20 (each provided with a connector 20e) are mounted in a frame 30. Namely, eight light emitting modules 100 are linked together in 2 rows and 4 columns. This type of structure allows the backlighting for large-area liquid crystal display devices to be manufactured inexpensively.

Incidentally, additional translucent material with properties such as light diffusion can be stacked together with the light guide plate 1. In that case, when the optically functional areas 2 are recessed regions, the openings of those recessed regions are covered by the additional translucent material, but preferably that translucent material does not fill in the recessed regions. This maintains an air layer inside the optically functional area 2 recessed regions and allows light from the light emitting devices 11 to spread laterally in a favorable manner.

Alternative Embodiment

Figure 8A:
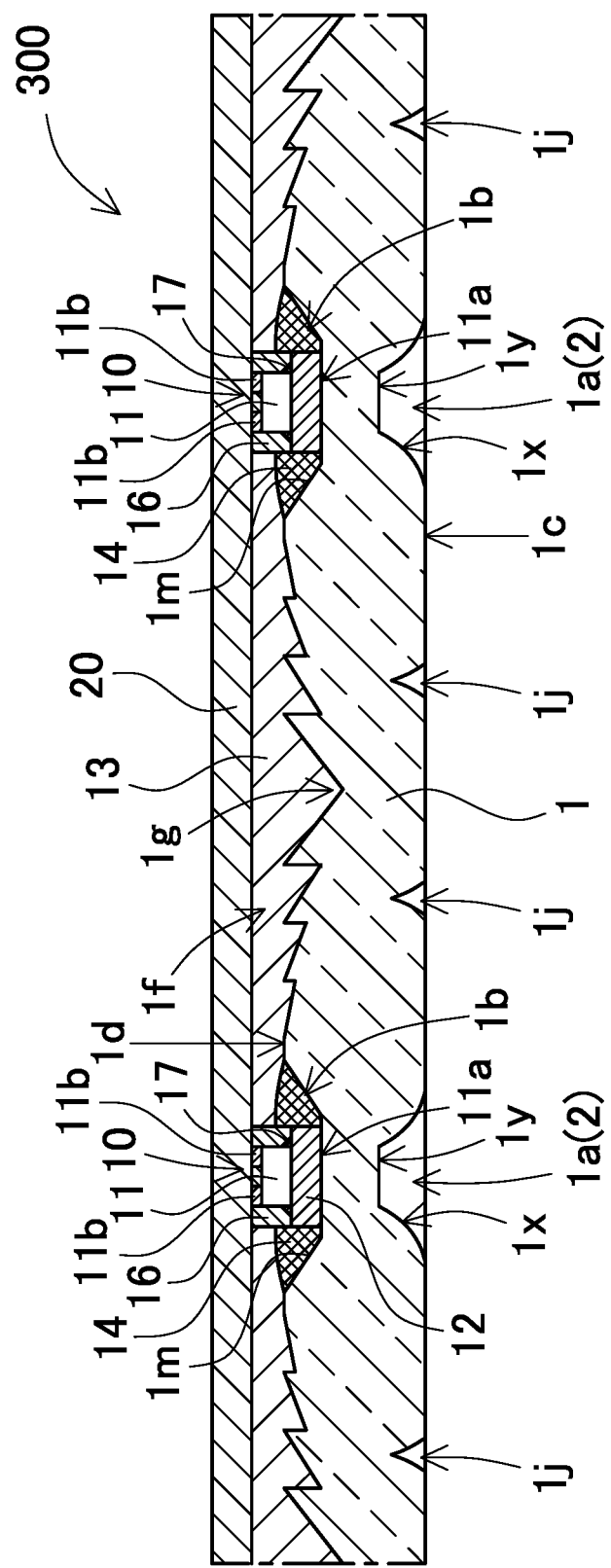
FIG. 8A is a schematic cross-section view with one section enlarged of a light emitting module according to an embodiment of the present disclosure.
Figure 8C:
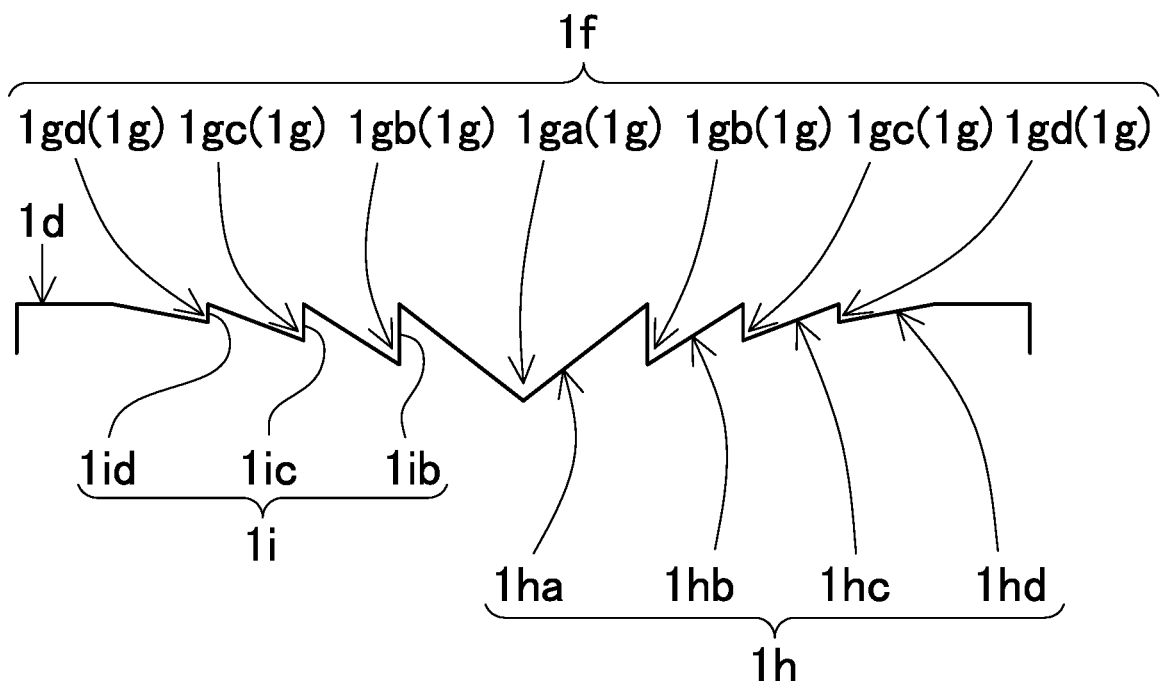
FIG. 8C is an enlarged schematic cross-section view of a section of the light guide plate in the light emitting module shown in FIG. 8A.

Turning to FIG. 8A, an enlarged cross-section view of the light emitting module 300 for an alternative example of the first embodiment is shown. FIG. 8B is a top view, vertical cross-section, horizontal cross-section, and bottom view of the light guide plate 1 of the light emitting module 300, and FIG. 8C is an enlarged schematic of the reflecting depression 1g region of the light guide plate 1 shown in FIG. 8A. The light emitting module 300 for this alternative example has reflecting depressions 1g established in the second primary surface 1d of the light guide plate 1. The light guide plate 1 shown in FIGS. 8A-8C is provided with a plurality of reflecting depressions 1g in a single cell region 6. The plurality of reflecting depressions 1g has the form of a saw-tooth reflecting section 1f (based on the cross-section outline). The reflecting depressions 1g have the form of grooves (ravines) with saw-tooth inclined surfaces that slope downward towards the boundary regions 7 of the light emitting cells 5. Inclined surfaces act as reflecting surfaces 1h that reflect light from the light emitting devices 11. The figures show an example of a light guide plate 1 in which each cell is provided with a saw-tooth reflecting section 1f made up of a first reflecting depression 1ga, a second reflecting depression 1gb, a third reflecting depression 1gc, and a fourth reflecting depression 1gd. Each reflecting depression 1g is provided with light reflecting surfaces 1ha, 1hb, 1hc, and 1hd and auxiliary surfaces 1ib, 1ic, and 1id. The reflecting depressions 1g are not limited to this number of grooves, and can be provided with any number of grooves greater than or equal to two. Each groove in the reflecting depression 1g is filled with encapsulant material 13 which is material with light reflecting properties.

The first reflecting depression 1ga has a depth of 0.6 mm and the light reflecting surface 1ha is inclined 58° with respect to the second primary surface 1d. The second reflecting depression 1gb has a depth of 0.50 mm and the light reflecting surface 1hb is inclined 45° with respect to the second primary surface 1d. The third reflecting depression 1gc has a depth of 0.31 mm and the light reflecting surface 1hc is inclined 32° with respect to the second primary surface 1d. The fourth reflecting depression 1gd has a depth of 0.15 mm and the light reflecting surface 1hd is inclined 16° with respect to the second primary surface 1d.

Second Embodiment

Figure 9B:
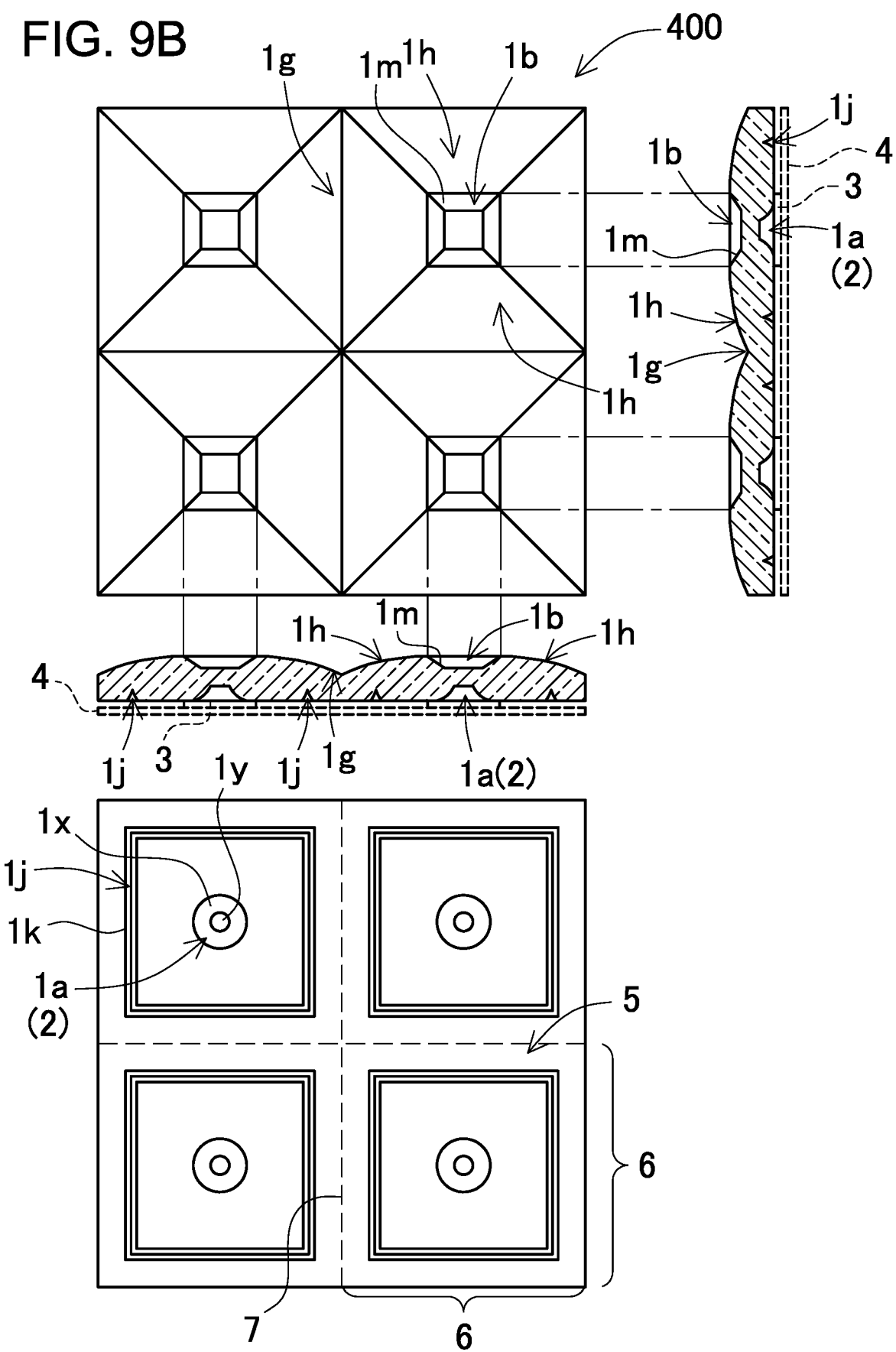
FIG. 9B is a top view, vertical cross-section, horizontal cross-section, and bottom view showing an example of a light guide plate according to an embodiment of the present disclosure.

FIG. 9A is an enlarged cross-section of a light emitting module 400 for the second embodiment. FIG. 9B shows a top view, vertical cross-section, horizontal cross-section, and bottom view of the light guide plate 1 of the light emitting module 400. The light emitting module 400 shown in FIG. 9A is provided with a light guide plate 1, light emitting devices 11 disposed on the light guide plate 1, and a light blocking and scattering layer 3 laminated on the front surface (first primary surface 1c) of the light guide plate 1. As shown in FIGS. 9A and 9B, the light emitting module 400 for the second embodiment differs in that a light blocking and scattering layer 3 is disposed on the front surface of the light guide plate 1. Other elements of the second embodiment are the same as those in the light emitting module 100 for the first embodiment, and their detailed description is omitted.

Light Blocking and Scattering Layer 3

The light emitting module 400 for the second embodiment has a light blocking and scattering layer 3 established in locations that cover the optically functional areas 2. By scattering and blocking light emitted from the light emitting devices 11 that shines through the optically functional areas 2 while avoiding light guide plate 1 strength reduction, the light blocking and scattering layer 3 reduces adverse effects of the optically functional areas 2 and suppresses brightness non-uniformity. In this light emitting module 400, unique structure that disposes the light blocking and scattering layer 3 and optically functional areas 2 in a laminated arrangement makes light from the light emitting devices 11 uniform with a high degree of accuracy and forms a high quality backlight light source with little brightness non-uniformity.

The light emitting module 400 in FIG. 9A maintains the fixed position of the light blocking and scattering layer 3 with a translucent sheet 4.

The light blocking and scattering layer 3 is disposed on the first primary surface 1c of the light guide plate 1 in locations covering the optically functional areas 2. The light blocking and scattering layer 3 scatters and blocks light that passes through the optically functional areas 2 to alleviate brightness concentration in those areas. Specifically, the light blocking and scattering layer 3 is sheet material such as translucent plastic or glass with pigment or dye additives. Pigments and dyes are preferably white to increase light reflectivity and suppress brightness non-uniformity while avoiding (or limiting) light emitting module 400 brightness reduction due to the light blocking and scattering layer 3. The light blocking and scattering layer 3 does not block incident light by absorption but rather blocks light by scattering the incident light. However, light blocking and scattering layer 3 pigment and dye can also have color such as red, orange, or yellow to absorb some of the incident light and control the color of light output from the light emitting module 400 while scattering and blocking light. In particular, in a light emitting module with blue light emitting diodes as the light emitting devices 11, a light blocking and scattering layer 3 that uses blue light absorbing pigments or dyes can change the wavelength of the blue light emitted by the light emitting diodes and emit color adjusted light to the outside.

The light blocking and scattering layer 3 is preferably resin that includes additives such as white pigment. Light blocking properties of the light blocking and scattering layer 3 can be adjusted by controlling the amount of pigment or dye added. Preferably, the light blocking and scattering layer 3 is silicone resin with titanium dioxide added as white pigment. The light blocking and scattering layer 3 controls the light transmittance of incident light by adjusting the amount of white pigment added. Incident light transmittance can be reduced by increasing the amount of white pigment additive in the resin of the light blocking and scattering layer 3. Light transmittance is the attenuation ratio of light passing in a straight line through the thickness direction of the light blocking and scattering layer 3 (and is equal to the intensity of light passing through the thickness direction of the light blocking and scattering layer 3 divided by the intensity of the incident light. The amount of white pigment additive is preferably less than or equal to 60 wt % to set light blocking and scattering layer 3 light transmittance to an optimal value. Namely, light blocking and scattering layer 3 light transmittance can be adjusted by controlling the ratio (dosage) of pigments and dyes added.

The light blocking and scattering layer 3 blocks light by reflecting and scattering incident light. When viewed in plan-view, the light blocking and scattering layer 3 covers optically functional areas 2. Optically functional areas 2 established on the first primary surface 1c of the light guide plate 1 spread light from the wavelength shifting sections 12 in lateral directions of the light guide plate 1 to suppress brightness non-uniformity. As shown by the arrow B in (the enlarged inset of) FIG. 9A, an optically functional area 2 reflects and diffuses some of the light internally reflected at the light guide plate 1 interface in a lateral direction (parallel to light guide plate 1 surfaces). Total internal reflection occurs when the incident angle θ (with respect to a normal to the interface) exceeds the critical angle. Light with an angle of incidence less than the critical angle is not internally reflected at the optically functional area 2-light guide plate 1 interface and is transmitted (refracted) to the outside. Light indicated by the arrow A in FIG. 9A has a small angle of incidence and is transmitted through the optically functional area 2 planar region 1y. The light blocking and scattering layer 3 blocks light transmitted through the optically functional areas 2 to suppress light emitting module 400 brightness non-uniformity.

The size of the light blocking and scattering layer 3 is set as required. In the light emitting module 400 of the figures, the outline of (opaque elements of) the light blocking and scattering layer 3 is larger than the outline of an optically functional area 2 (viewed in plan-view) to completely cover each optically functional area 2. Further, although not illustrated, (opaque elements of) the light blocking and scattering layer 3 can be made with an outline essentially equal to the outline of each optically functional area 2, or can be made with an outline larger than the outline of the optically functional area 2 planar region 1y and smaller than the outline of optically functional area 2.

In addition to reflecting depressions 1g and reflecting grooves 1j, a light emitting module 400 with a light blocking and scattering layer 3 stacked on each optically functional area 2 not only diffuses light, which shines into the light guide plate 1 from a light emitting device 11 light emitting surface 11a, to surrounding regions away from the optical axis via the optically functional area 2, but also blocks light, which shines along each optical axis and passes through the light guide plate 1 and optically functional area 2, via the light blocking and scattering layer 3. This blocks intense light on the light emitting device 11 optical axis and diffuses it to surrounding regions. By shining the (laterally) diffused light to the outside with the reflecting grooves 1j, the light emitting module 400 can be made thin overall while more effectively suppressing brightness non-uniformity. Since the light blocking and scattering layer 3 is disposed covering the optically functional area 2 aligned with each light emitting device 11 optical axis, light transmitted through each optically functional area 2 can be blocked and scattered by the light blocking and scattering layer 3 to further reduce brightness non-uniformity. In addition, the light blocking and scattering layer 3 can reduce brightness non-uniformity due to misalignment between optically functional areas 2 and light emitting devices 11. Accordingly, light emitting modules 400 with little brightness non-uniformity and a thin profile can be efficiently manufactured in quantity.

As mentioned above, the light emitting module 400 has optically functional areas 2 established on the first primary surface 1c of the light guide plate 1 and has a light blocking and scattering layer 3 disposed in locations covering the optically functional areas 2 (viewed in plan-view). Each optically functional area 2 is disposed on the optical axis of a light emitting device 11 and the light blocking and scattering layer 3 is also disposed on the optical axis of the light emitting device 11. Consequently, light emitted from a light emitting device 11 shines outside the light emitting module 400 through both the optically functional area 2 and the light blocking and scattering layer 3.

Several embodiments of the present invention are described as illustrative examples above. However, the present invention is not limited to the embodiments described above and it should go without saying that any implementation is possible that does not deviate from essence of the invention.

The light emitting module of the present disclosure can be used, for example, as backlighting for a liquid crystal display device.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims.

What is claimed is:

1. A light emitting module comprising:
a translucent light guide plate having
a first primary surface that serves as a light emitting surface that emits light to the outside and
a second primary surface opposite the first primary surface; and
a plurality of light sources disposed at given intervals on the second primary surface of the light guide plate,
wherein the light guide plate has a plurality of light emitting cell regions,
wherein each of the plurality of light emitting cell regions has one of the plurality of light sources disposed in a center section thereof,
wherein each of the plurality of cell regions has an optically functional area established on the first primary surface, and each of the plurality of light sources is disposed on the second primary surface in a position opposite the optically functional area,
wherein the second primary surface has a plurality of reflecting depressions, wherein at least one of the plurality of reflecting depressions is located at a cell boundary between adjacent light-emitting cell regions,
wherein the first primary surface has a plurality of reflecting grooves positioned away from the center of each of the plurality of light-emitting cell regions only near the cell boundary,
wherein a portion of the first primary surface between the optically functional area and an adjacent one of the reflecting grooves is flat without a projection or a depression, and
wherein a deepest part of the reflecting grooves is disposed off-set with respect to a deepest part of the reflecting depressions.

2. The light emitting module as cited in claim 1, wherein the reflecting depressions are filled with a first light reflecting material.

3. The light emitting module as cited in claim 2, wherein each of the plurality of light sources comprises
a light emitting device,
a wavelength shifting section that covers a primary light emitting surface of the light emitting device, and
a second light reflecting material that covers one or more sides of the light emitting device, and
wherein the first light reflecting material covers one or more sides of the light source and the second primary surface of the light guide plate.

4. The light emitting module as cited in claim 1, wherein the plurality of reflecting grooves have shapes that follow a perimeter of each of the plurality of light-emitting cell regions.

5. The light emitting module as cited in claim 1, wherein each of the plurality of light-emitting cell regions has a square shape.

6. The light emitting module as cited in claim 1, wherein each of the plurality of reflecting grooves is a trench or a groove having an inclined surface that slope with respect to the first primary surface.

7. The light emitting module as cited in claim 1, wherein at least one of the plurality of reflecting grooves has an inclined surface, and wherein an angle of inclination α between the inclined surface and the first primary surface gradually increases moving away from the first primary surface.

8. The light emitting module as cited in claim 1, wherein at least one of the plurality of reflecting depressions comprises a light reflecting hill and a light reflecting valley, and
wherein at least one of the plurality of reflecting depressions is a groove with inclined surfaces on both sides that slope downward towards a light emitting cell boundary region.

9. The light emitting module as cited in claim 2, wherein the plurality of reflecting grooves have shapes that follow a perimeter of each of the plurality of light-emitting cell regions.

10. The light emitting module as cited in claim 3, wherein the plurality of reflecting grooves have shapes that follow a perimeter of each of the plurality of light-emitting cell regions.

11. The light emitting module as cited in claim 2, wherein each of the plurality of reflecting grooves is a trench or a groove having inclined surfaces that slope with respect to the first primary surface.

12. The light emitting module as cited in claim 3, wherein each of the plurality of reflecting grooves is a trench or a groove having inclined surfaces that slope with respect to the first primary surface.

13. The light emitting module as cited in claim 4, wherein each of the plurality of reflecting grooves is a trench or a groove having inclined surfaces that slope with respect to the first primary surface.

14. The light emitting module as cited in claim 5, wherein each of the plurality of reflecting grooves is a trench or a groove having inclined surfaces that slope with respect to the first primary surface.

15. The light emitting module as cited in claim 10, wherein each of the plurality of reflecting grooves is a trench or a groove having inclined surfaces that slope with respect to the first primary surface.

16. The light emitting module as cited in claim 2, wherein at least one of the plurality of reflecting grooves has an inclined surface, and wherein an angle of inclination α between the inclined surface and the first primary surface gradually increases moving away from the first primary surface.

17. The light emitting module as cited in claim 3, wherein at least one of the plurality of reflecting grooves has an inclined surface, and wherein an angle of inclination α between the inclined surface and the first primary surface gradually increases moving away from the first primary surface.

18. The light emitting module as cited in claim 4, wherein at least one of the plurality of reflecting grooves has an inclined surface, and wherein an angle of inclination α between the inclined surface and the first primary surface gradually increases moving away from the first primary surface.

19. The light emitting module as cited in claim 5, wherein at least one of the plurality of reflecting grooves has an inclined surface, and wherein an angle of inclination α between the inclined surface and the first primary surface gradually increases moving away from the first primary surface.

20. The light emitting module as cited in claim 10, wherein at least one of the plurality of reflecting grooves has an inclined surface, and wherein an angle of inclination α between the inclined surface and the first primary surface gradually increases moving away from the first primary surface.

* * * * *